US011831533B2

(12) United States Patent
Dugar et al.

(10) Patent No.: US 11,831,533 B2
(45) Date of Patent: Nov. 28, 2023

(54) PERFORMANCE MONITORING IN A DATA CENTER WITH SHARED TENANTS

(71) Applicant: Honeywell International Inc., Charlotte, NC (US)

(72) Inventors: Devanshu Dugar, Kolkata (IN); Jayaprakash Meruva, Bangalore (IN); Madhav Kamath, Bengaluru (IN); Magesh Lingan, Bangalore (IN); Rajkumar Palanivel, Cumming, GA (US); Srikanth Nagaraj, Bangalore (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 56 days.

(21) Appl. No.: 17/696,033

(22) Filed: Mar. 16, 2022

(65) Prior Publication Data

US 2023/0300052 A1  Sep. 21, 2023

(51) Int. Cl.
| | |
|---|---|
| H04L 43/16 | (2022.01) |
| H05K 7/20 | (2006.01) |
| H04L 67/12 | (2022.01) |
| H04L 41/06 | (2022.01) |
| H04L 43/045 | (2022.01) |
| H04L 43/08 | (2022.01) |

(52) U.S. Cl.
CPC ........... *H04L 43/16* (2013.01); *H04L 41/06* (2013.01); *H04L 43/045* (2013.01); *H04L 43/08* (2013.01); *H04L 67/12* (2013.01); *H05K 7/20836* (2013.01)

(58) Field of Classification Search
None
See application file for complete search history.

(56) References Cited

U.S. PATENT DOCUMENTS

| 8,904,497 B2 | 12/2014 | Hsieh |
| 9,098,320 B2 | 8/2015 | Yung |

(Continued)

FOREIGN PATENT DOCUMENTS

JP  6834773 B2  2/2021

OTHER PUBLICATIONS

"Data Center Efficiency: The Benefits of RCI & RTI," (Part 2 of 3), Blog, Posted by RF Code, 10 pages, May 11, 2021.

(Continued)

*Primary Examiner* — Jeffrey R Swearingen
(74) *Attorney, Agent, or Firm* — Seager, Tufte & Wickhem, LLP

(57) ABSTRACT

A data center includes a plurality of tenants, with some of the server racks within the data center specifically assigned to each of the tenants. A monitoring system may be configured to generate unique tenant dashboards that allow each tenant to view a variety of different information pertaining to the server racks that are assigned to them without allowing other tenants to view their dashboards. The system is configured to generate the unique tenant view for each tenant based on tenant profile information collected by the data center as part of a tenant onboarding process and input into the first and second tenant profiles. The system reads the various parameters in the first and second tenant profiles and automatically generates the unique tenant dashboards for each tenant without having to make programming changes to other parts of the system.

20 Claims, 22 Drawing Sheets

(56) References Cited

U.S. PATENT DOCUMENTS

| | | |
|---|---|---|
| 9,762,460 B2 | 9/2017 | Pawlowski et al. |
| 9,903,737 B2 | 2/2018 | Carpenter et al. |
| 9,912,192 B2 | 3/2018 | Miller |
| 9,958,178 B2 | 5/2018 | Palmer et al. |
| 10,254,720 B2 | 4/2019 | Slessman et al. |
| 10,447,546 B1 | 10/2019 | Guo et al. |
| 10,817,398 B2 | 10/2020 | Cencini et al. |
| 10,983,891 B2 | 4/2021 | Dadd et al. |
| 11,284,544 B1* | 3/2022 | Lingle ................ G06F 11/3058 |
| 2016/0087859 A1* | 3/2016 | Kuan .................... H04L 41/122 715/736 |
| 2016/0087861 A1* | 3/2016 | Kuan .................... H04L 43/065 709/224 |
| 2016/0198593 A1 | 7/2016 | Schmitt et al. |
| 2017/0201424 A1 | 7/2017 | Doraiswamy et al. |
| 2017/0219241 A1 | 8/2017 | Magcale et al. |
| 2018/0052574 A1 | 2/2018 | Wolfe et al. |
| 2018/0293038 A1 | 10/2018 | Meruva et al. |
| 2019/0145645 A1 | 5/2019 | Magcale |
| 2020/0349155 A1 | 11/2020 | Reinshagen et al. |

OTHER PUBLICATIONS

"Enterprise Dashboard,"—Galileo Performance Explorer Blog, 8 pages, May 13, 2021.
Alfsolli, "Environmental Monitoring with Zabbix," Zabbix Blog, 8 pages, May 13, 2021.
"Galileo Performance Explorer—IT Capacity & Performance Management," Blog, The Explorer, 7 pages, May 13, 2021.
"Galileo Performance Explorer—SAN Performance Monitoring," ATS Group, 1 page, 2021.
"Galileo—the Stars Align Overview," Galileo Performance Explorer, 1 page, 2017.
"Galileo Use Cases Capacity Planning," Galileo Performance Explorer, 1 page, 2018.
"Galileo Solution Guide Performance Monitoring Vmware," ATS Group, 20 pages, 2021.
"Operational Intelligence" Galileo Performance Explorer, 8 pages, May 13, 2021.
"Performance Monitoring" Galileo Performance Explorer, 8 pages, May 13, 2021.
"Predictive Analytics" Galileo Performance Explorer, 8 pages, May 13, 2021.
Lambert, "Trend Prediction Tutorial in Zabbix 4.0," Zabbix Blog, 2019.
"Data Center Vigilent," 4 pages, 2022.
"Dynamic Control," Vigilent, 5 pages, 2022.
"Dynamic Optimization," Vigilent, 2 pages, 2022.
"Energy Savings," Vigilent, 2 pages, 2022.
"Insite Infrastructure Monitoring," VExchange Colocation Services, 5 pages, 2021.
"Machine Learning Vigilent," 5 pages, 2022.
"Monitoring," Vigilent, 5 pages, 2022.
"Reclaim Cooling Capacity," Vigilent, 2 pages, 2022.
"Struxture Ware Data Center Operation," Schneider Electric, 4 pages, 2017.
"System Architecture," Vigilent 3 pages, 2022.
"Uptime Protection," Vigilent, 4 pages, 2022.

* cited by examiner

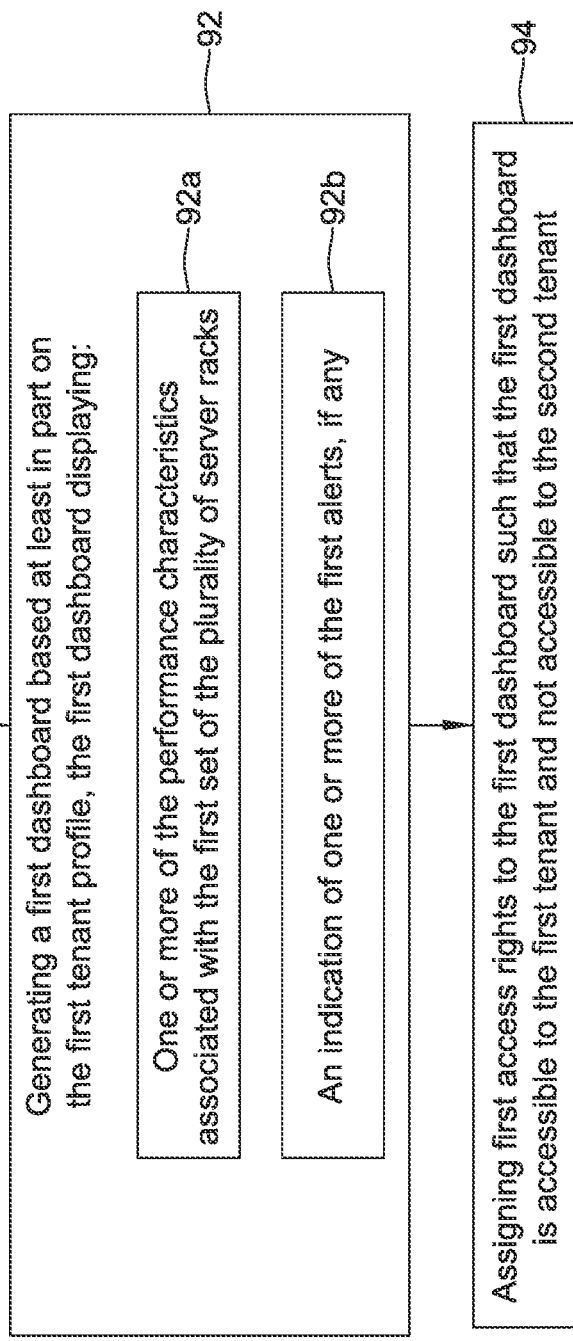

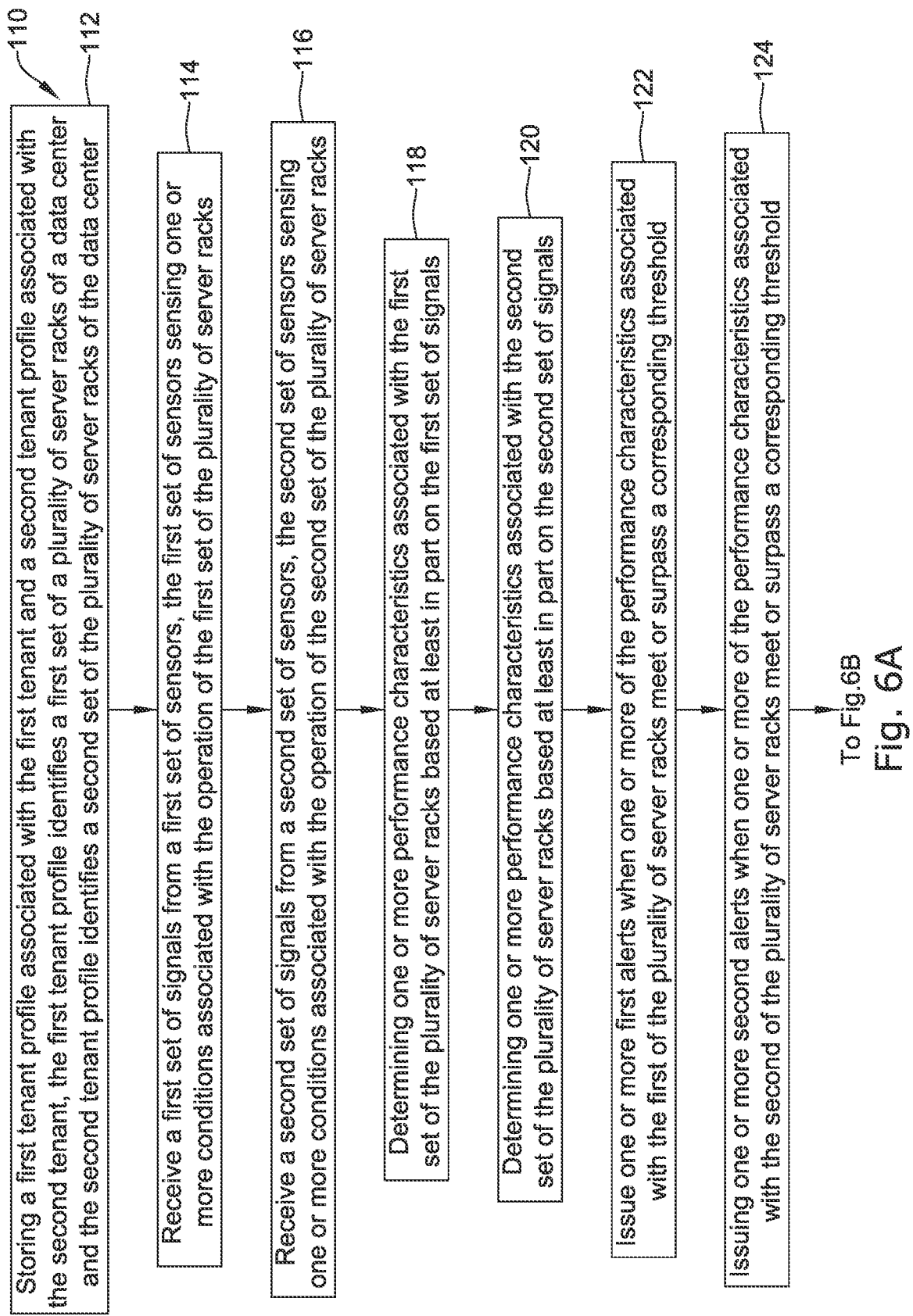

— 110

126 — Receive user input from one or more remote devices

From Fig. 6A

128 — In response to receiving a first user input from the first tenant via one or more of the remote devices, generate a first dashboard based at least in part on the first tenant profile, the first dashboard displaying:

128a — One or more of the performance characteristics associated with the first set of the plurality of server racks, wherein the first tenant profile identifies at least one of the performance characteristics that is to be displayed by the first dashboard 128b — An indication of one or more of the first alerts, if any 130 — Assign first access rights to the first dashboard such that the first dashboard is accessible to the first tenant and not accessible to the second tenant To Fig. 6C

Fig. 6B

From Fig. 6B

In response to receiving a second user input from the second tenant via one or more of the remote devices, generate a second dashboard based at least in part on the second tenant profile, the second dashboard displaying:

One or more of the performance characteristics associated with the second set of the plurality of server racks, wherein the second tenant profile identifies at least one of the performance characteristics that is to be displayed by the second dashboard An indication of one or more of the second alerts, if any Assign second access rights to the second dashboard such that the second dashboard is accessible to the second tenant and not accessible to the first tenant

Fig. 6C

PERFORMANCE MONITORING IN A DATA CENTER WITH SHARED TENANTS

TECHNICAL FIELD

The present disclosure pertains generally to monitoring data centers and more particularly to systems and methods for monitoring data centers.

BACKGROUND

A data center typically includes a number of computer servers in close proximity to each other arranged in server racks. Some data servers are setup by a business to serve just that business. However, many data centers serve a number of different tenants, each assigned to particular computer servers within the data center. A data center may be divided into a number of server racks, with each server rack having a number of computer servers. In some cases, each tenant may be assigned to one or more server racks within the data center.

A need remains for improved systems and methods for quickly and easily providing individual tenants of a multiple-tenant data center information that gives each tenant a transparent view of the performance of the server racks(s) to which they are assigned.

SUMMARY

This disclosure relates generally to systems and methods for quickly and easily providing individual tenants of a multiple-tenant data center information that gives each tenant a transparent view of the performance of the server racks(s) to which they are assigned. Individual tenants may have a desire to know the performance characteristics associated with the server rack(s) that are assigned to them. This may include information such as the power consumed by their assigned server rack(s), the relative usage of computing resources and/or storage resources within their assigned server rack(s), the communication bandwidth consumed by their assigned server rack(s), the communication bandwidth available to their assigned server rack(s), the environmental conditions in and/or around their assigned server rack(s), and/or other information and/or condition. In some cases, some of these performance characteristics may influence how the individual tenants are billed for their assigned server rack(s). For example, if the data center is not proper maintaining previously agreed upon conditions supporting the assigned server rack(s), the tenant may be charged a reduced fee. Likewise, if server rack(s) assigned to a tenant are using more communication bandwidth or power over agreed upon limits, the tenant may be charged a surcharge. In either case, the individual tenants of a multiple-tenant data center may have a desired to monitor the performance characteristics associated with their assigned server racks(s).

An example may be found in a system for monitoring performance of a data center. The data center includes a plurality of server racks with a first set of the plurality of server racks assigned to a first tenant of the data center and a second set of the plurality of server racks assigned to a second tenant of the data center, wherein the first set of the plurality of server racks and the second set of the plurality of server racks are disjoint sets. The illustrative system includes a memory for storing a first tenant profile associated with the first tenant and a second tenant profile associated with the second tenant. The first tenant profile identifying the first set of the plurality of server racks and the second tenant profile identifying the second set of the plurality of server racks. The illustrative system includes a controller that is operably coupled with the memory and that is configured to receive a first set of signals from a first set of sensors. The first set of sensors sensing one or more conditions associated with the operation of the first set of the plurality of server racks. The controller is also configured to receive a second set of signals from a second set of sensors. The second set of sensors sensing one or more conditions associated with the operation of the second set of the plurality of server racks. The controller is configured to determine one or more performance characteristics associated with the first set of the plurality of server racks based at least in part on the first set of signals and to issue one or more first alerts when one or more of the performance characteristics associated with the first of the plurality of server racks meet or surpass a corresponding threshold. Likewise, the controller is configured to determine one or more performance characteristics associated with the second set of the plurality of server racks based at least in part on the second set of signals and to issue one or more second alerts when one or more of the performance characteristics associated with the second of the plurality of server racks meet or surpass a corresponding threshold.

The controller is configured to generate a first dashboard based at least in part on the first tenant profile. The first dashboard displaying one or more of the performance characteristics associated with the first set of the plurality of server racks, and an indication of one or more of the first alerts, if any. The controller is configured to assign first access rights to the first dashboard such that the first dashboard is accessible to the first tenant and not accessible to the second tenant.

The controller is further configured to generate a second dashboard based at least in part on the second tenant profile. The second dashboard displaying one or more of the performance characteristics associated with the second set of the plurality of server racks, and an indication of one or more of the second alerts, if any. The controller is configured to assign second access rights to the second dashboard such that the second dashboard is accessible to the second tenant and not accessible to the first tenant.

Another example may be found in a method for monitoring performance of a data center, the data center including a plurality of server racks with a first set of the plurality of server racks assigned to a first tenant of the data center and a second set of the plurality of server racks assigned to a second tenant of the data center, wherein the first set of the plurality of server racks and the second set of the plurality of server racks are disjoint sets. The method includes storing a first tenant profile associated with the first tenant and a second tenant profile associated with the second tenant. The first tenant profile identifying the first set of the plurality of server racks and the second tenant profile identifying the second set of the plurality of server racks. A first set of signals is received from a first set of sensors, the first set of sensors sensing one or more conditions associated with the operation of the first set of the plurality of server racks. One or more performance characteristics associated with the first set of the plurality of server racks are determined based at least in part on the first set of signals. One or more first alerts are issued when one or more of the performance characteristics associated with the first of the plurality of server racks meet or surpass a corresponding threshold.

User input is received from one or more remote devices. In response to receiving a first user input from the first tenant via one or more of the remote devices, generating a first dashboard based at least in part on the first tenant profile, the first dashboard displaying one or more of the performance characteristics associated with the first set of the plurality of server racks, and an indication of one or more of the first alerts, if any. First access rights are assigned to the first dashboard such that the first dashboard is accessible to the first tenant and not accessible to the second tenant.

Another example may be found in a non-transitory, computer-readable storage medium having instructions stored on the storage medium. When the instructions are executed by one or more processors, the one or more processors are caused to store a first tenant profile associated with a first tenant and a second tenant profile associated with a second tenant. The first tenant profile identifies a first set of a plurality of server racks of a data center and the second tenant profile identifies a second set of the plurality of server racks of the data center. The one or more processors are caused to receive a first set of signals from a first set of sensors, the first set of sensors sensing one or more conditions associated with the operation of the first set of the plurality of server racks. The one or more processors are also caused to receive a second set of signals from a second set of sensors, the second set of sensors sensing one or more conditions associated with the operation of the second set of the plurality of server racks. The one or more processors are further caused to determine one or more performance characteristics associated with the first set of the plurality of server racks based at least in part on the first set of signals and to determine one or more performance characteristics associated with the second set of the plurality of server racks based at least in part on the second set of signals. The one or more processors are caused to issue one or more first alerts when one or more of the performance characteristics associated with the first of the plurality of server racks meet or surpass a corresponding threshold and to issue one or more second alerts when one or more of the performance characteristics associated with the second of the plurality of server racks meet or surpass a corresponding threshold.

The one or more processors are caused to receive user input from one or more remote devices, and in response to receiving a first user input from the first tenant via one or more of the remote devices, generate a first dashboard based at least in part on the first tenant profile. The first dashboard displays one or more of the performance characteristics associated with the first set of the plurality of server racks, wherein the first tenant profile identifies at least one of the performance characteristics that is to be displayed by the first dashboard, and an indication of one or more of the first alerts. The one or more processors are caused to assign first access rights to the first dashboard such that the first dashboard is accessible to the first tenant and not accessible to the second tenant.

In response to receiving a second user input from the second tenant via one or more of the remote devices, the one or more processors are caused to generate a second dashboard based at least in part on the second tenant profile. The second dashboard displays one or more of the performance characteristics associated with the second set of the plurality of server racks, wherein the second tenant profile identifies at least one of the performance characteristics that is to be displayed by the second dashboard, and an indication of one or more of the second alerts, if any. The one or more processors are caused to assign second access rights to the second dashboard such that the second dashboard is accessible to the second tenant and not accessible to the first tenant.

In some cases, the system is configured to generate a unique tenant view (e.g. dashboard) for each tenant based on tenant profile information collected by the data center as part of a tenant onboarding process, and input into the first and second tenant profiles having predefined fields. The system may read the various parameters in the first and second tenant profiles and automatically generate the unique tenant views (dashboards) for each tenant, without having to make programming changes to other parts of the system.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which:

FIGS. 5A, 5B, 5C and 5D are flow diagrams that together show an illustrative method for monitoring the performance of a data center such as the illustrative data center of FIG. 1;

FIGS. 6A, 6B and 6C are flow diagrams that together show an illustrative series of steps that may be carried out by one or more processors executing executable instructions for monitoring the performance of a data center such as the illustrative data center of FIG. 1;

Figure 1:
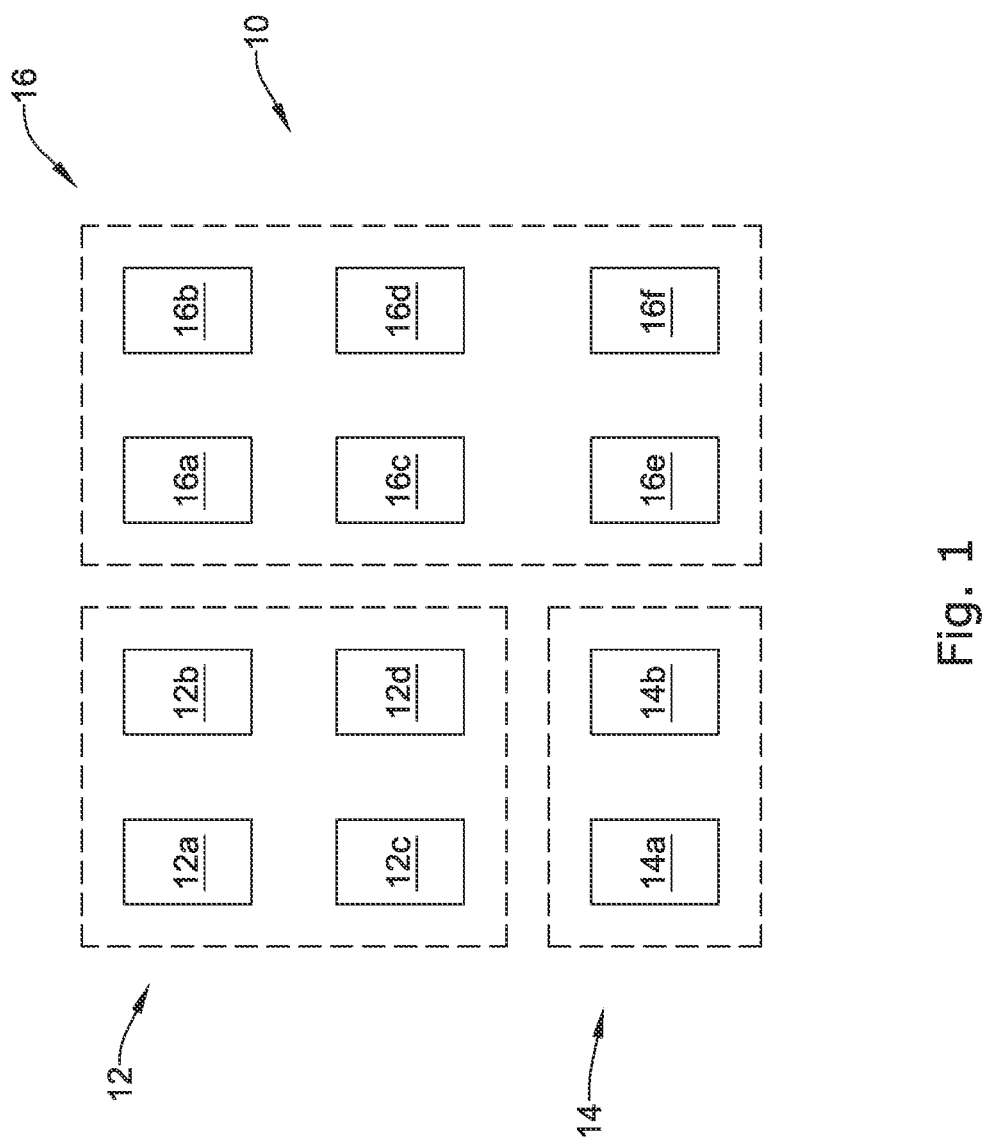
FIG. 1 is a schematic block diagram of an illustrative data center.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements. The drawings, which are not necessarily to scale, are not intended to limit the scope of the disclosure.

In some of the figures, elements not believed necessary to an understanding of relationships among illustrated components may have been omitted for clarity.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

FIG. 1 is a schematic block diagram of an illustrative data center 10. The illustrative data center 10 includes a large number of server racks. It will be appreciated that this is a highly schematic view, as the data center 10 may include additional components such as a security system limiting access to the data center 10, HVAC (heating, ventilating and air conditioning) equipment such as CRACs (computer room air conditioner) and CRAHs (computer room air handlers). Each server rack includes a number of computer servers.

As shown, the data center 10 includes a first grouping 12 of server racks, individually labeled as 12a, 12b, 12c and 12d; a second grouping 14 of server racks individually labeled as 14a and 14b; and a third grouping 16 of server racks individually labeled as 16a, 16b, 16c, 16d, 16e and 16f. In some cases, the first grouping 12 of server racks may be considered as being assigned to a first tenant. The second grouping 14 of server racks may be considered as being assigned to a second tenant. The third grouping 16 of server racks may be considered as being assigned to a third tenant. This is merely illustrative, as the data center 10 may have any number of server racks, divided into any number of groupings of server racks.

Figure 2:
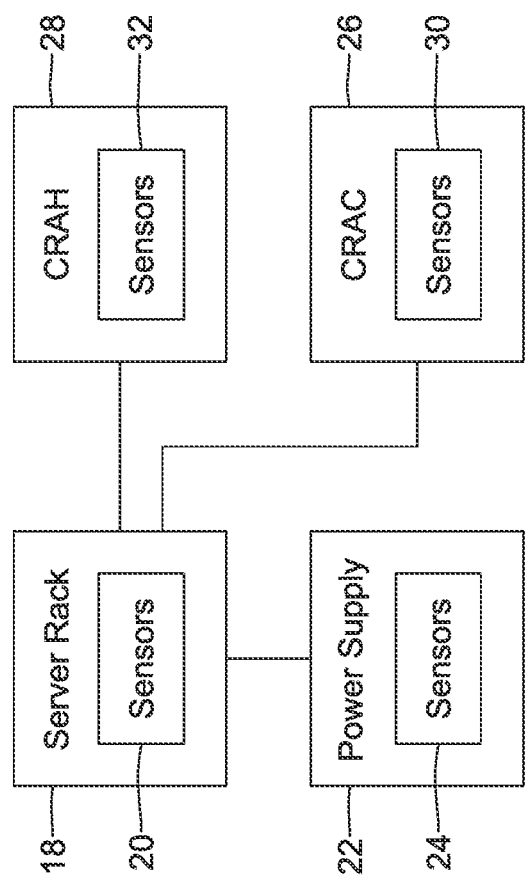
FIG. 2 is a schematic block diagram of a portion of the illustrative data center of FIG. 1.

FIG. 2 is a schematic block diagram of a portion of the illustrative data center 10. FIG. 2 shows a single server rack 18 that may be considered as being an example of any of the server racks 12a, 12b, 12c, 12d, 14a, 14b, 16a, 16b, 16c, 16d, 16e and 16f. Any features ascribed to the server rack 18 may be considered as being applicable to any of the server racks 12a, 12b, 12c, 12d, 14a, 14b, 16a, 16b, 16c, 16d, 16e and 16f. Any features ascribed to any of the server racks 12a, 12b, 12c, 12d, 14a, 14b, 16a, 16b, 16c, 16d, 16e and 16f nay be considered as being applicable to the server rack 18. In the example shown, the server rack 18 includes one or more sensors 20 that are configured to sense any of a variety of performance parameters within the server rack 18 itself. In some cases, the sensor 20 may include temperature sensors, humidity sensors, power consumption sensors, communication bandwidth sensors, a server blade presence sensor, and/or any other suitable sensor.

A power supply 22 provides power to the server rack 18 so that the server rack 18 is able to operate. The power supply 22 may be considered as being part of a larger power system disposed within a building or other facility in which the data center 10 is located. The power supply 22 may include one or more sensors 24 that are configured to sense any of a variety of power-related parameters that describe and define the power being provided to the server rack 18 by the power supply 22.

In the example shown, a CRAC unit 26 provides conditioned air to the server rack 18. In some cases, a CRAH unit 28 may provide conditioned air to the server rack 18. In some cases, the data center 10 may include a plurality of CRAC units 26 and/or a plurality of CRAH units 28. In some instances, the data center 10 may include one or more cooling units that combine the functionality of the CRAC unit 26 and the CRAH unit 28. In the example shown, the CRAC unit 26 includes one or more sensors 30 that are configured to sense any of a variety of performance parameters such as but not limited to temperature and humidity parameters. The illustrative CRAH unit 28 includes one or more sensors 32 that are configured to sense any of a variety of performance parameters such as but not limited to temperature and humidity parameters.

Figure 3:
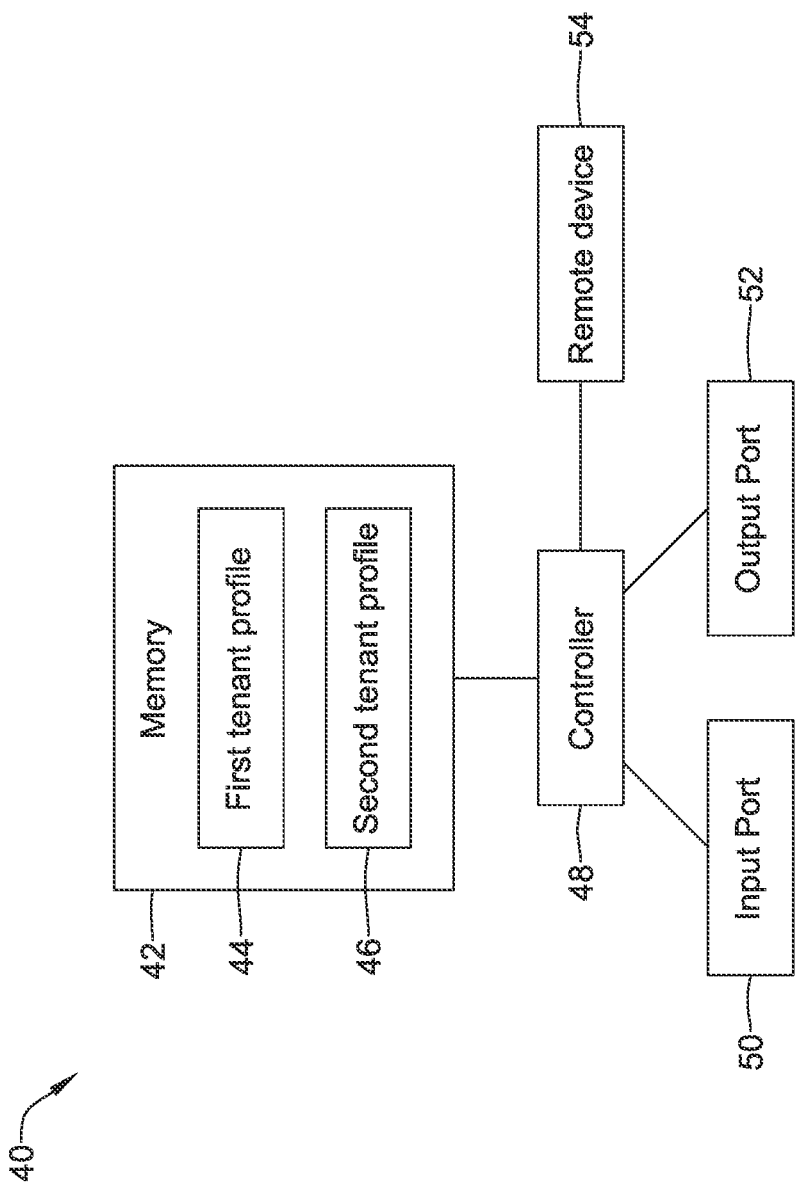
FIG. 3 is a schematic block diagram of an illustrative system for monitoring the performance of a data center such as the illustrative data center of FIG. 1.

It will be appreciated that the one or more sensors 20, the one or more sensors 24, the one or more sensors 30 and/or the one or more sensors 32 may provide a significant volume of sensor data that is of importance in operating the data center 10, and that may be of interest to the tenants of the data center 10 and the data center itself. FIG. 3 is a schematic block diagram of an illustrative system 40 that is configured to receive the significant volume of sensor data and to generate useful dashboards for consumption by the individual tenants of the data center 10. The illustrative system 40 may also function to manage operations of the data center 10, although in some instances there may be a separate management system for managing operations of the data center 10.

As seen in FIG. 3, the illustrative system 40 includes a memory 42 for storing a first tenant profile 44 that is associated with a first tenant and a second tenant profile 46 that is associated with a second tenant. In some cases, the system 40 is configured to generate a unique tenant view (e.g. dashboard) for each tenant based on tenant profile information collected by the data center during a tenant onboarding process, and input into the first tenant profile 44 and the second tenant profile 46 having predefined fields. A controller 48 of the system 40 may read the various parameters in the first and second tenant profiles 44, 46 and automatically generate the unique tenant views (dashboards) for each tenant without having to make programming changes to other parts of the system.

In one example, the first tenant profile 44 identifies, among other things, a first set of the plurality of server racks that are assigned to the first tenant. Likewise, the second tenant profile 46 identifies a second set of the plurality of server racks assigned to the second tenant. In some cases, the first tenant profile 44 may identify which of the one or more performance characteristics associated with the first set of the plurality of server racks are to be included in the first dashboard, and the second tenant profile 46 may identify which of the one or more performance characteristics associated with the second set of the plurality of server racks are to be included in the second dashboard.

In some cases, and as an example, the first set of the plurality of server racks may correspond to the first group 12 of server racks individually labeled as 12a, 12b, 12c and 12d in FIG. 1, and the second set of the plurality of server racks may correspond to the second group 14 of server racks individually labeled as 14a and 14b in FIG. 1. The controller 48 of the system 40 is operably coupled with the memory 42 and is operably coupled with an input port 50 that is configured to receive sensor signals from any of a variety of sensors, including but not limited to the one or more sensors 20, the one or more sensors 24, the one or more sensors 30 and/or the one or more sensors 32. The controller 48 is also operably coupled with an output port 52 that allows the controller 48 to output information such as but not limited to dashboards generated by the controller 48 and alerts generated by the controller 48. The input port 50 is also configured to receive signals such as instructions or requests from one or more remote devices 54. The remote device 54 may be a computer, mobile device, or any other remote device that is located away from the data center 10, perhaps at a tenant's location.

The controller 48 is configured to receive a first set of signals from a first set of sensors, the first set of sensors sensing one or more conditions associated with the operation of the first set of the plurality of server racks. The one or more conditions associated with the operation of the first set of the plurality of server racks may include, for example, two or more of a temperature, a humidity and a power usage associated with each of the plurality of server racks of the first set of the plurality of server racks. In some cases, the one or more conditions associated with the operation of the first set of the plurality of server racks may include all three of a temperature, a humidity and a power usage associated with each of the plurality of server racks of the first set of the plurality of server racks.

The controller 48 is also configured to receive a second set of signals from a second set of sensors, the second set of sensors sensing one or more conditions associated with the operation of the second set of the plurality of server racks. The one or more conditions associated with the operation of the second set of the plurality of server racks may include, for example, two or more of a temperature, a humidity and a power usage associated with each of the plurality of server racks of the first set of the plurality of server racks. In some cases, the one or more conditions associated with the operation of the second set of the plurality of server racks may include all three of a temperature, a humidity and a power usage associated with each of the plurality of server racks of the first set of the plurality of server racks.

The controller 48 is configured to determine one or more performance characteristics associated with the first set of the plurality of server racks based at least in part on the first set of signals and to issue one or more first alerts when one or more of the performance characteristics associated with the first of the plurality of server racks meet or surpass a corresponding threshold. Likewise, the controller 48 is configured to determine one or more performance characteristics associated with the second set of the plurality of server racks based at least in part on the second set of signals and to issue one or more second alerts when one or more of the performance characteristics associated with the second of the plurality of server racks meet or surpass a corresponding threshold.

The controller 48 is configured to generate a first dashboard based at least in part on the first tenant profile. The first dashboard may display one or more of the performance characteristics associated with the first set of the plurality of server racks, and an indication of one or more of the first alerts. The controller 48 is configured to assign first access rights to the first dashboard such that the first dashboard is accessible to the first tenant and not accessible to the second tenant. The controller 48 is configured to generate a second dashboard based at least in part on the second tenant profile. The second dashboard may display one or more of the performance characteristics associated with the second set of the plurality of server racks, and an indication of one or more of the second alerts, if any. The controller 48 is configured to assign second access rights to the second dashboard such that the second dashboard is accessible to the second tenant and not accessible to the first tenant.

The controller 48 may be configured to predict one or more expected future values of one or more of the performance characteristics associated with the first set of the plurality of server racks, and to display one or more of the predict expected future values on the first dashboard. The first dashboard may further display an identity of one or more individuals that accessed one or more of the first set of the plurality of server racks during a period of time, wherein the period of time is adjustable by the first tenant. Likewise, the controller 48 may be configured to predict one or more expected future values of one or more of the performance characteristics associated with the second set of the plurality of server racks, and to display one or more of the predict expected future values on the second dashboard. The second dashboard may further display an identity of one or more individuals that accessed one or more of the second set of the plurality of server racks during a period of time, wherein the period of time is adjustable by the second tenant.

In some instances, the controller 48 may be configured to receive user input from the remote device 54. The first dashboard may be generated by the controller 48 in response to receiving a first user input from the first tenant via the remote device 54. The second dashboard may be generated by the controller 48 in response to receiving a second user input from the second tenant via the remote device 54. The remote device 54 may represent a plurality or remote devices, wherein the first tenant provides the first user input via a first remote device 54 and the second tenant provides the second user input via a second remote device 54.

In some cases, the controller 48 may be configured to issue a first maintenance ticket for action by the data center 10. For example, in response to one or more of the first alerts displayed on the first dashboard, the first tenant may provide a first user input requesting a first maintenance ticket for action by the data center 10. The first dashboard may display the first maintenance ticket and in some cases a current status of the first maintenance ticket (open, resolved, etc.). Likewise, in response to one or more of the second alerts displayed on the second dashboard, the second tenant may provide a second user input requesting a second maintenance ticket for action by the data center 10. The second dashboard may display the second maintenance ticket and in some cases a current status of the second maintenance ticket (open, resolved, etc.).

In some instances, the controller 48 may be configured to generate a data center dashboard that displays one or more of the performance characteristics associated with the first set of the plurality of server racks, one or more of the performance characteristics associated with the second set of the plurality of server racks, and an operational status of one or more HVAC components (such as the CRAC 26 and the CRAH 28) servicing the data center 10. This may provide a data center view representative of the operation of the data center 10.

The controller 48 may be configured to automatically generate one or more control actions to control at least part of the data center 10 based at least in part on one or more of the performance characteristics associated with the first set of the plurality of server racks and/or one or more of the performance characteristics associated with the second set of the plurality of server racks. The controller 48 may also be configured to automatically execute the one or more control actions. The one or more control actions may include sending commands to adjust the operation of one or more of the CRAC 26 and/or CRAH 28 components that service the data center, send one or more commands to redirect more or less power to one or more server rack(s) in the data center 10, send one or more commands to assign more or less communication bandwidth to one or more server rack(s) in the data center 10, send one or more commands to limit or expand access to maintenance or other personnel to one or more server rack(s) in the data center 10, and/or perform any other suitable action as desired.

In some instances, the controller 48 may be configured to automatically identify one or more events based at least in part on one or more of the performance characteristics associated with the first set of the plurality of server racks and/or one or more of the performance characteristics associated with the second set of the plurality of server racks. The one or more events may be automatically identified when, for example, a performance characteristic exceeds a corresponding threshold or limit, sometimes continuously for at least a predetermined period of time and/or repeated a predetermined number of times within a predetermined time period. In some cases, one or more control actions may be automatically generated in response to one or more of the automatically identified events.

Figure 4A:
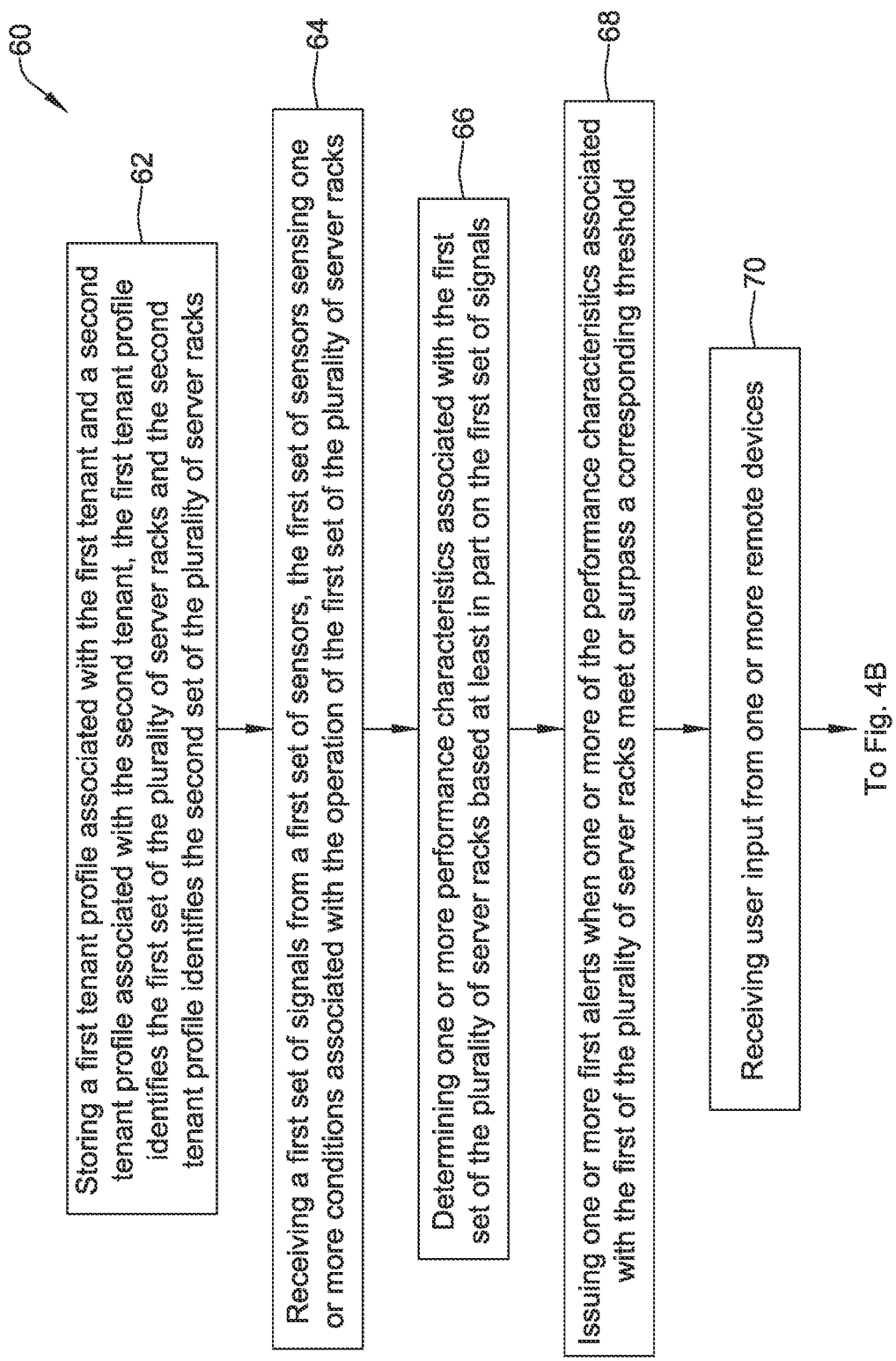
FIGS. 4A and 4B are flow diagrams that together show an illustrative method for monitoring the performance of a data center such as the illustrative data center of FIG. 1.
Figure 4B:
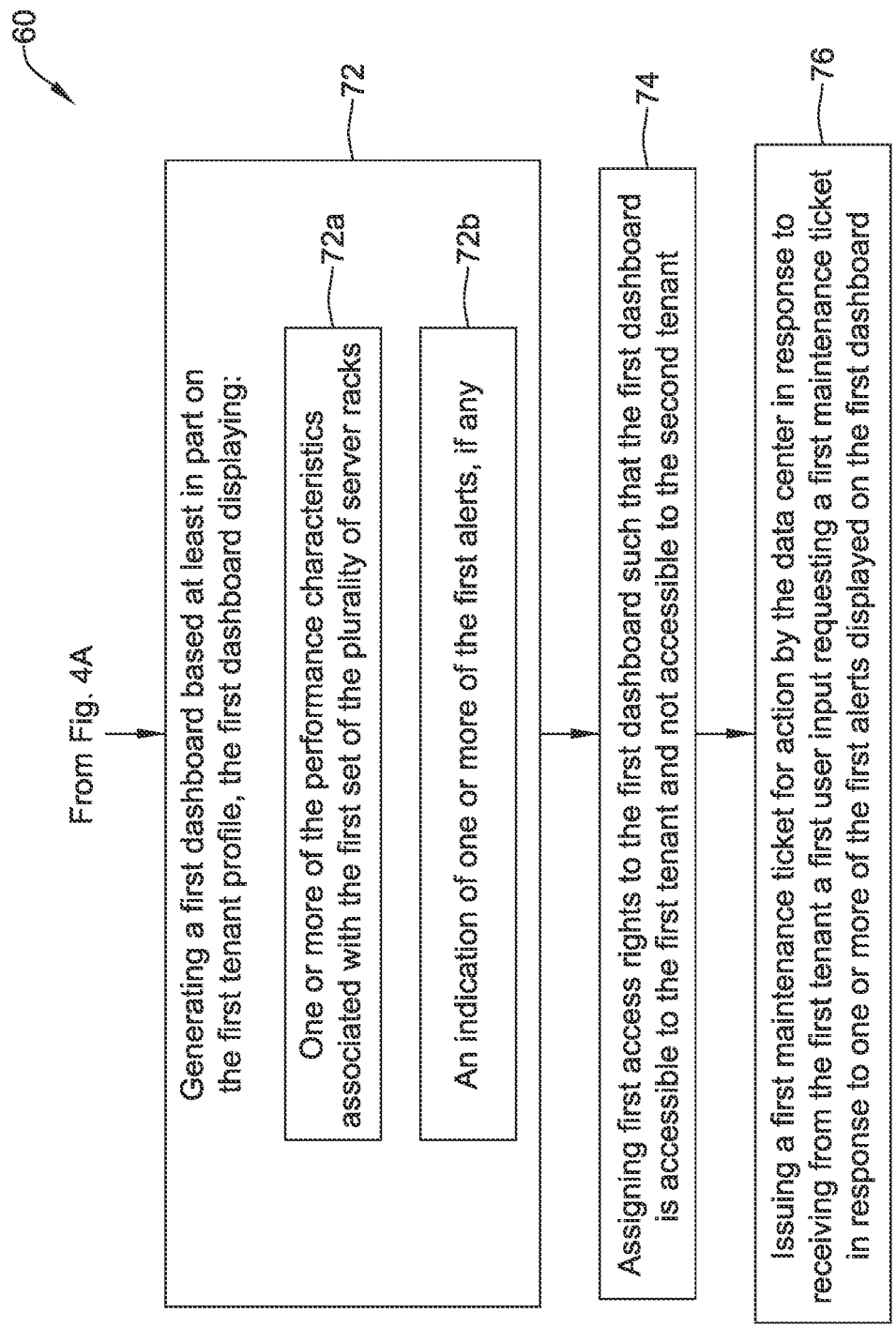

FIGS. 4A and 4B are flow diagrams that together show an illustrative method 60 for monitoring performance of a data center (such as the data center 10). The data center includes a plurality of server racks with a first set of the plurality of server racks assigned to a first tenant of the data center and a second set of the plurality of server racks assigned to a second tenant of the data center. In some cases, the first set of the plurality of server racks and the second set of the plurality of server racks are disjoint sets. The illustrative method 60 includes storing a first tenant profile associated with the first tenant and a second tenant profile associated with the second tenant, the first tenant profile identifies the first set of the plurality of server racks and the second tenant profile identifies the second set of the plurality of server racks, as indicated at block 62. A first set of signals is received from a first set of sensors. The first set of sensors sensing one or more conditions associated with the operation of the first set of the plurality of server racks, as indicated at block 64. In some cases, the one or more conditions associated with the operation of the first set of the plurality of server racks may include a temperature, a humidity and a power usage associated with each of the plurality of server racks of the first set of the plurality of server racks.

One or more performance characteristics associated with the first set of the plurality of server racks are determined based at least in part on the first set of signals, as indicated at block 66. One or more first alerts are issued when one or more of the performance characteristics associated with the first of the plurality of server racks meet or surpass a corresponding threshold, as indicated at block 68. User input may be received from one or more remote devices (such as the remote device 54), as indicated at block 70.

Continuing on FIG. 4B, in response to receiving a first user input from the first tenant via one or more of the remote devices, the illustrative method 60 includes generating a first dashboard based at least in part on the first tenant profile, as indicated at block 72. The first dashboard displays one or more of the performance characteristics associated with the first set of the plurality of server racks, as indicated at block 72a. In some cases, the first dashboard displays an indication of one or more of the first alerts, if any, as indicated at block 72b. The illustrative method 60 also includes assigning first access rights to the first dashboard such that the first dashboard is accessible to the first tenant and not accessible to the second tenant, as indicated at block 74. In some cases, and as indicated at block 76, in response to receiving from the first tenant a first user input requesting a first maintenance ticket in response to one or more of the first alerts displayed on the first dashboard, the method 60 may include displaying a first maintenance ticket on the first dashboard for action by the data center, and in some cases, the current status of the first maintenance ticket.

FIGS. 5A, 5B, 5C and 5D are flow diagrams that together show an illustrative method 80 for monitoring performance of a data center (such as the data center 10). The data center includes a plurality of server racks with a first set of the plurality of server racks assigned to a first tenant of the data center and a second set of the plurality of server racks assigned to a second tenant of the data center. The first set of the plurality of server racks and the second set of the plurality of server racks may be disjoint sets. The illustrative method 80 includes storing a first tenant profile associated with the first tenant and a second tenant profile associated with the second tenant. The first tenant profile identifies the first set of the plurality of server racks and the second tenant profile identifies the second set of the plurality of server racks, as indicated at block 82. A first set of signals is received from a first set of sensors. The first set of sensors sensing one or more conditions associated with the operation of the first set of the plurality of server racks, as indicated at block 84. In some cases, the one or more conditions associated with the operation of the first set of the plurality of server racks may include a temperature, a humidity and a power usage associated with each of the plurality of server racks of the first set of the plurality of server racks.

One or more performance characteristics associated with the first set of the plurality of server racks are determined based at least in part on the first set of signals, as indicated at block 86. One or more first alerts are automatically issued when one or more of the performance characteristics associated with the first of the plurality of server racks meet or surpass a corresponding threshold, as indicated at block 88. User input is received from one or more remote devices (such as the remote device 54), as indicated at block 90.

Continuing on FIG. 5B, in response to receiving a first user input from the first tenant via one or more of the remote devices, the method 80 includes generating a first dashboard based at least in part on the first tenant profile, as indicated at block 92. The first dashboard displays one or more of the performance characteristics associated with the first set of the plurality of server racks, as indicated at block 92a. The first dashboard displays an indication of one or more of the first alerts, if any, as indicated at block 92b. The illustrative method 80 includes assigning first access rights to the first dashboard such that the first dashboard is accessible to the first tenant and not accessible to the second tenant, as indicated at block 94.

Figure 5A:
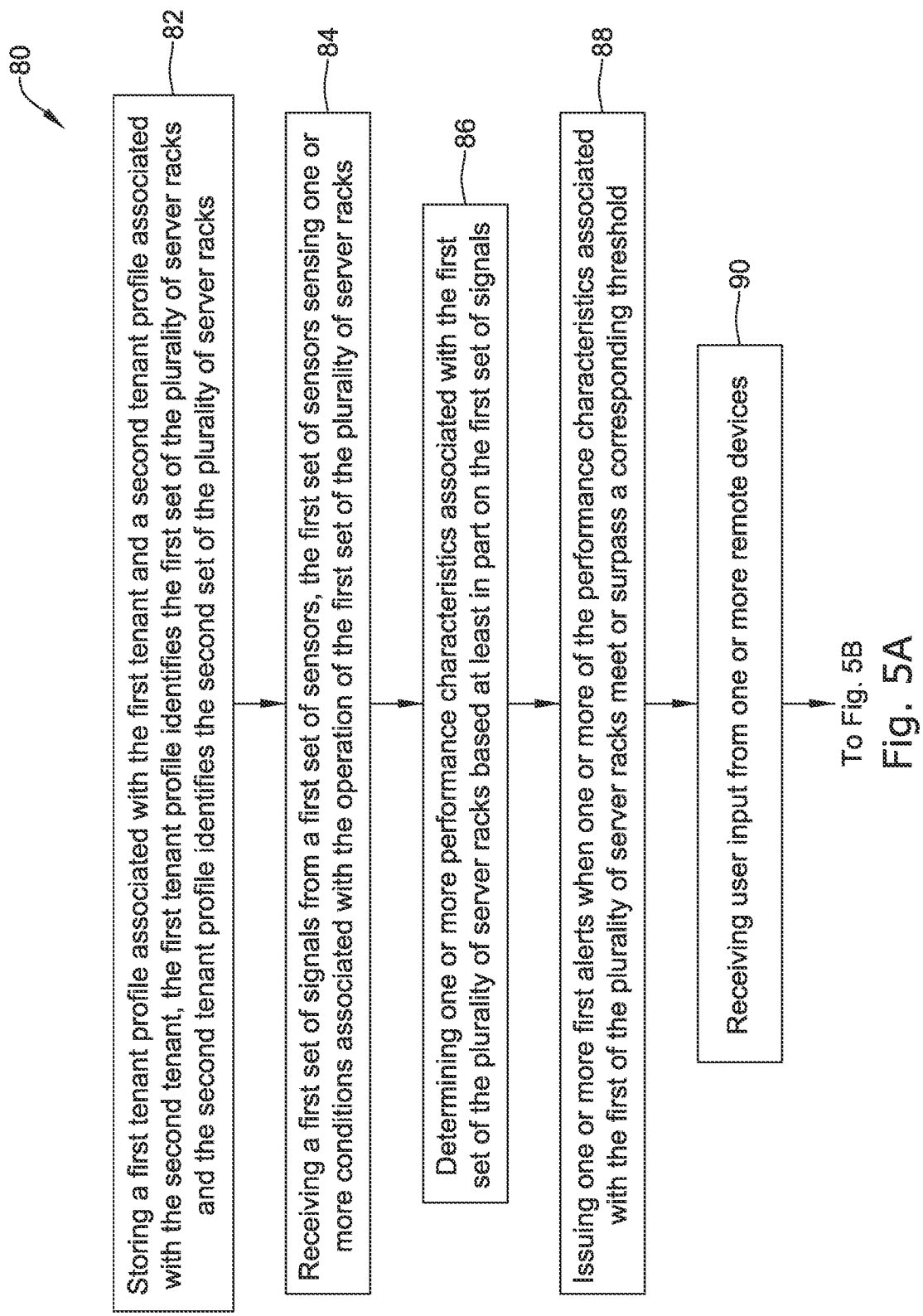
Figure 5C:
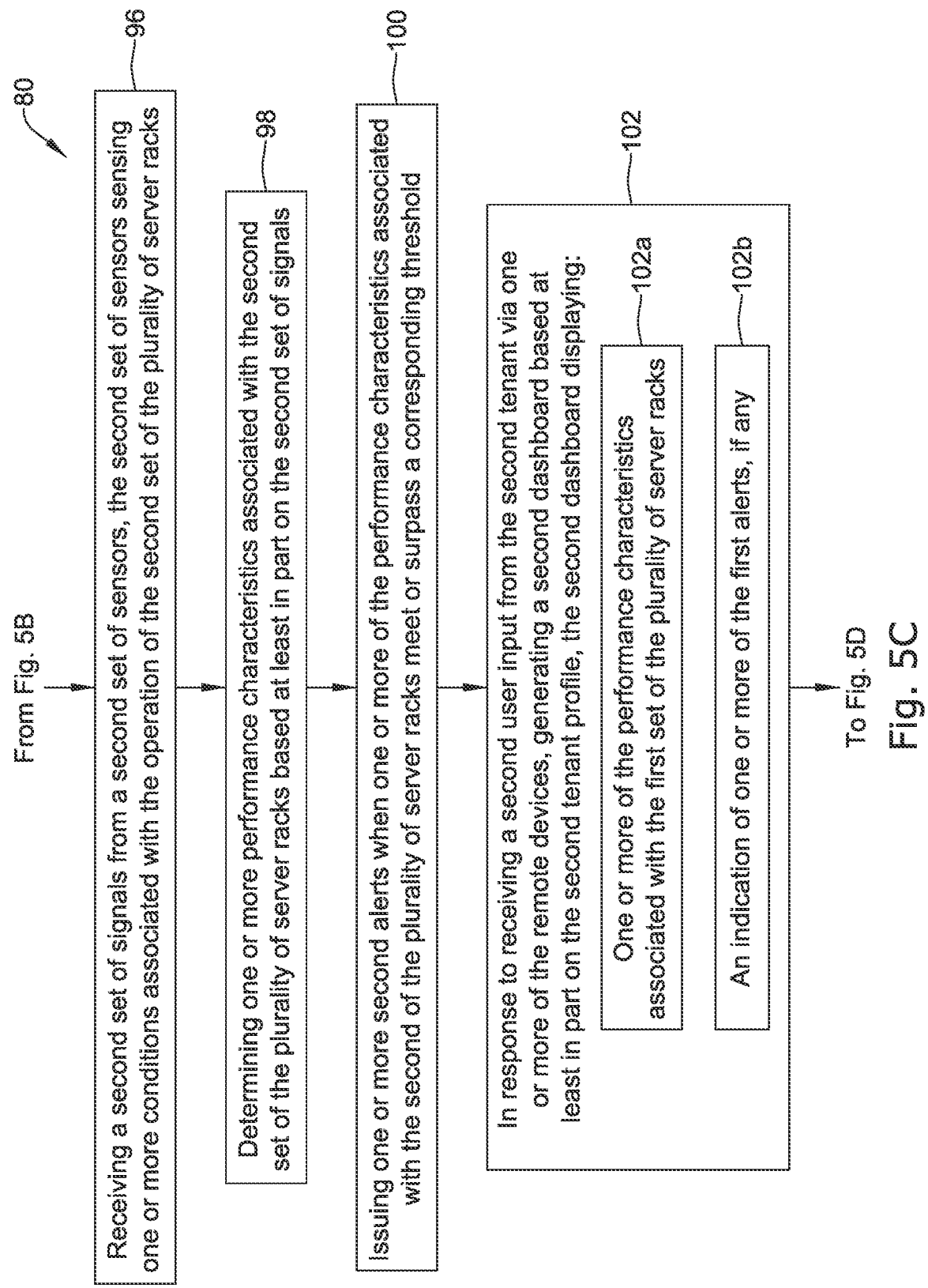
Figure 5D:
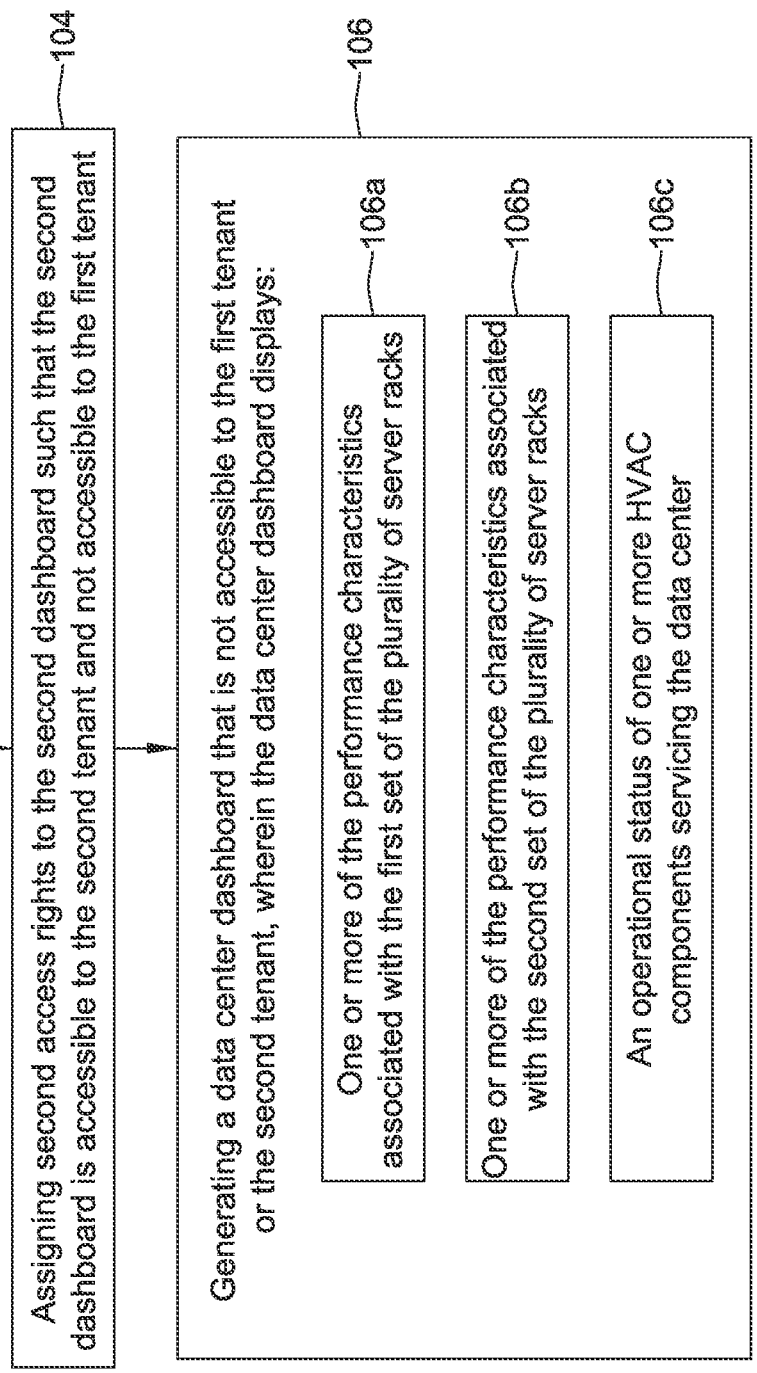

Continuing on FIG. 5C, the method 80 includes receiving a second set of signals from a second set of sensors. The second set of sensors sensing one or more conditions associated with the operation of the second set of the plurality of server racks, as indicated at block 96. One or more performance characteristics associated with the second set of the plurality of server racks are determined based at least in part on the second set of signals, as indicated at block 98. One or more second alerts are issued when one or more of the performance characteristics associated with the second of the plurality of server racks meet or surpass a corresponding threshold, as indicated at block 100. In response to receiving a second user input from the second tenant via one or more of the remote devices, a second dashboard is generated based at least in part on the second tenant profile, as indicated at block 102. The second dashboard displays one or more of the performance characteristics associated with the second set of the plurality of server racks, as indicated at block 102a, and an indication of one or more of the second alerts, if any, as indicated at block 102b. Continuing on FIG. 5D, the illustrative method 80 includes assigning second access rights to the second dashboard such that the second dashboard is accessible to the second tenant and not accessible to the first tenant, as indicated at block 104.

A data center dashboard that is not accessible to the first tenant or to the second tenant may be generated, as indicated at block 106. The data center dashboard displays one or more of the performance characteristics associated with the first set of the plurality of server racks, as indicated at block 106a. The data center dashboard displays one or more of the performance characteristics associated with the second set of the plurality of server racks, as indicated at block 106b. The data center dashboard may also display an operational status of one or more HVAC components servicing the data center, as indicated at block 106c. In some cases, the data center dashboard may display an operational status of one or more power supplies of the data center, an operational status of one or more backup power supplies, a current status of surveillance and/or intrusion system, a current status of one or more of maintenance tickets, and/or any other information suitable for monitoring and/or managing the operation of the data center.

FIGS. 6A, 6B and 6C are flow diagrams that together show an illustrative series of steps 110 that may be carried out by one or more processors executing executable instructions for monitoring the performance of a data center (such as the data center 10). A first tenant profile associated with a first tenant and a second tenant profile associated with a second tenant are stored. The first tenant profile identifying a first set of a plurality of server racks of a data center and the second tenant profile identifying second set of the plurality of server racks of the data center, as indicated at block 112. A first set of signals is received from a first set of sensors. The first set of sensors sensing one or more conditions associated with the operation of the first set of the plurality of server racks, as indicated at block 114. A second set of signals is received from a second set of sensors. The second set of sensors sensing one or more conditions associated with the operation of the second set of the plurality of server racks, as indicated at block 116.

One or more performance characteristics associated with the first set of the plurality of server racks are determined based at least in part on the first set of signals, as indicated at block 118. One or more performance characteristics associated with the second set of the plurality of server racks are determined based at least in part on the second set of signals, as indicated at block 120. One or more first alerts are issued when one or more of the performance characteristics associated with the first of the plurality of server racks meet or surpass a corresponding threshold, as indicated at block 122. One or more second alerts are issued when one or more of the performance characteristics associated with the second of the plurality of server racks meet or surpass a corresponding threshold, as indicated at block 124.

Continuing on FIG. 6B, the series of steps 110 continues with receiving user input from one or more remote devices, as indicated at block 126. In response to receiving a first user input from the first tenant via one or more of the remote devices, a first dashboard is generated based at least in part on the first tenant profile, as indicated at block 128. The first dashboard displays one or more of the performance characteristics associated with the first set of the plurality of server racks, wherein the first tenant profile identifies at least one of the performance characteristics that is to be displayed by the first dashboard, as indicated at block 128a. In some cases, the first tenant can select which of the at least one of the performance characteristics are to be displayed by the first dashboard, and the first tenant selections can be saved to the first tenant profile. The first dashboard displays an indication of one or more of the first alerts, if any, as indicated at block 128b. First access rights are assigned to the first dashboard such that the first dashboard is accessible to the first tenant and not accessible to the second tenant, as indicated at block 130.

Continuing on FIG. 6C, the series of steps 110 continues. In response to receiving a second user input from the second tenant via one or more of the remote devices, a second dashboard is generated based at least in part on the second tenant profile, as indicated at block 132. The second dashboard displays one or more of the performance characteristics associated with the second set of the plurality of server racks, wherein the second tenant profile identifies at least one of the performance characteristics that is to be displayed by the second dashboard, as indicated at block 132a. In some cases, the second tenant can select which of the at least one of the performance characteristics are to be displayed by the second dashboard, and the second tenant selections can be saved to the second tenant profile. The second dashboard displays an indication of one or more of the second alerts, if any, as indicated at block 132b. Second access rights are assigned to the second dashboard such that the second dashboard is accessible to the second tenant and not accessible to the first tenant, as indicated at block 134.

In some cases, the one or more processors are caused to generate a data center dashboard that is not accessible to the first tenant or the second tenant, wherein the data center dashboard displays one or more of the performance characteristics associated with the first set of the plurality of server racks, one or more of the performance characteristics associated with the second set of the plurality of server racks, and an operational status of one or more HVAC components servicing the data center. In some cases, the data center dashboard may display an operational status of one or more power supplies of the data center, an operational status of one or more backup power supplies, a current status of surveillance and/or intrusion system, a current status of one or more of maintenance tickets, and/or any other information suitable for monitoring and/or managing the operation of the data center.

Figure 7:
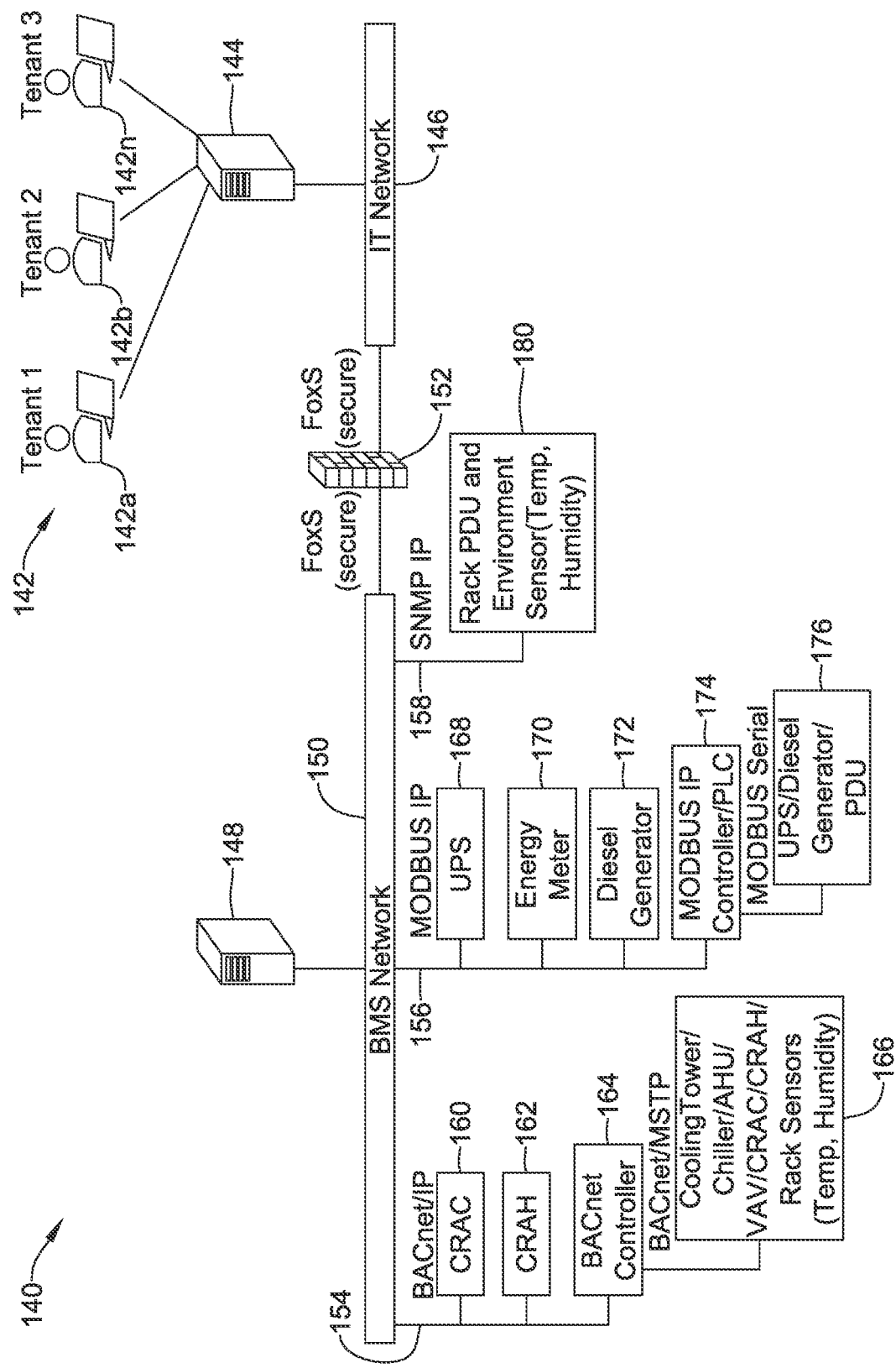
FIG. 7 is a schematic block diagram of an illustrative system architecture.

FIG. 7 is a schematic block diagram of an illustrative system architecture 140 that shows how individual components of a data center (such as the data center 10) communicate. A number of tenants 142, individually labeled as 142a, 142b through 142n, are able to communicate over the Internet with a tenant manager 144. The tenant manager 144 may be a computer, for example, and may be operably coupled with an IT network 146. A computer 148 monitors and/or controls operation of the data center, and is operably coupled with a BMS (building management system) network 150. The BMS network 150 may be separated from the IT network 146 via a firewall 152. The firewall 152 may be configured to permit communication through the firewall 152 when appropriate security precautions are in place.

In some instances, the BMS network 150 may be operably coupled with one or more of a BACnet network 154, a Modbus network 156 and an SNMP network 158, with a variety of devices operably coupled to each of the BACnet network 154, the Modbus network 156 and the SNMP network 158. For example, CRAC units 160 (such as the CRAC unit 26) and CRAH units 162 (such as the CRAH unit 28) may be operably coupled to the BACnet network 154. A BACnet controller 164 may be operably coupled to the BACnet network 154, and may control operation of a cooling tower and other cooling equipment 166.

The Modbus network 156 may include a UPS (uninterruptible power supply) 168, an energy meter 170 and a diesel generator 172. A Modbus controller 174 may be operably coupled to the Modbus network 156, and may control operation of particular features of a power supply 176 for the data center. The SNMP network 158 may be operably coupled with environmental sensors 180 within one or more server racks, or throughout the data center. These are just examples. While use of a BACnet network 154, a Modbus network 156 and a SNMP network 158 are shown, it is contemplated that only one network type may be used (e.g. BACnet), more than three network types may be used, and/or a different combination of network types may be used, depending on the application.

Figure 8:
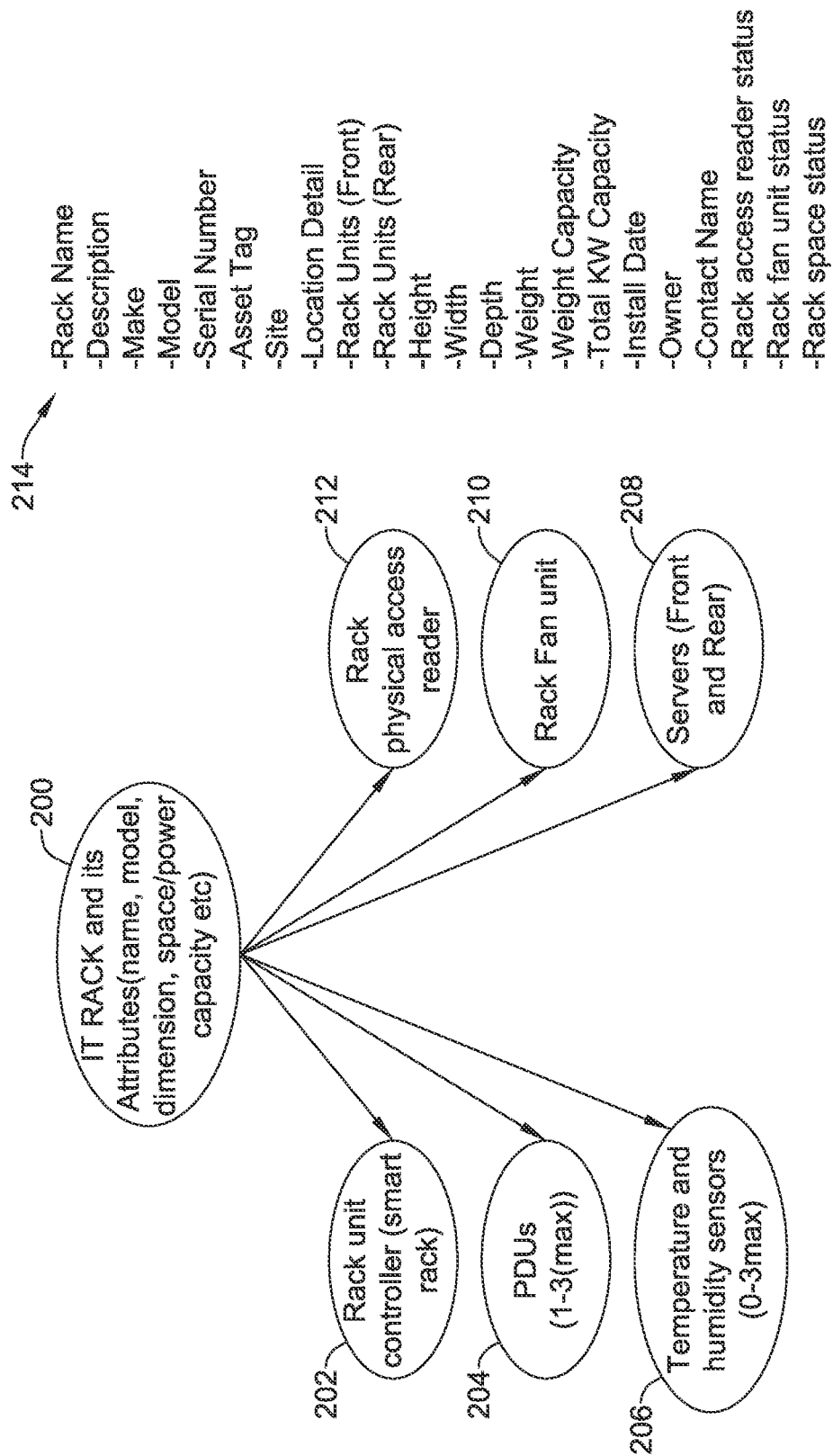
FIG. 8 is a schematic representation of server rack and equipment attributes.

FIG. 8 is a schematic representation of an example server rack and equipment attributes. A server rack 200, which may be considered as being an example of the server racks 12a, 12b, 12c, 12d, 14a, 14b, 16a, 16b, 16c, 16d, 16e and 16f, has a number of attributes and features, including a rack unit controller 202, one to three PDUs (power distribution units) 204, up to three temperature and humidity sensors 206, front and rear computer servers 208, a rack fan unit 210 and an access system 212 that controls physical access to the server rack 200. A listing 214 provides examples of data points and/or other information that may be of interest in monitoring the performance of the server rack 200. Some or all of this information may be included in the tenant profile that is associated with the server rack 200.

Figure 9:
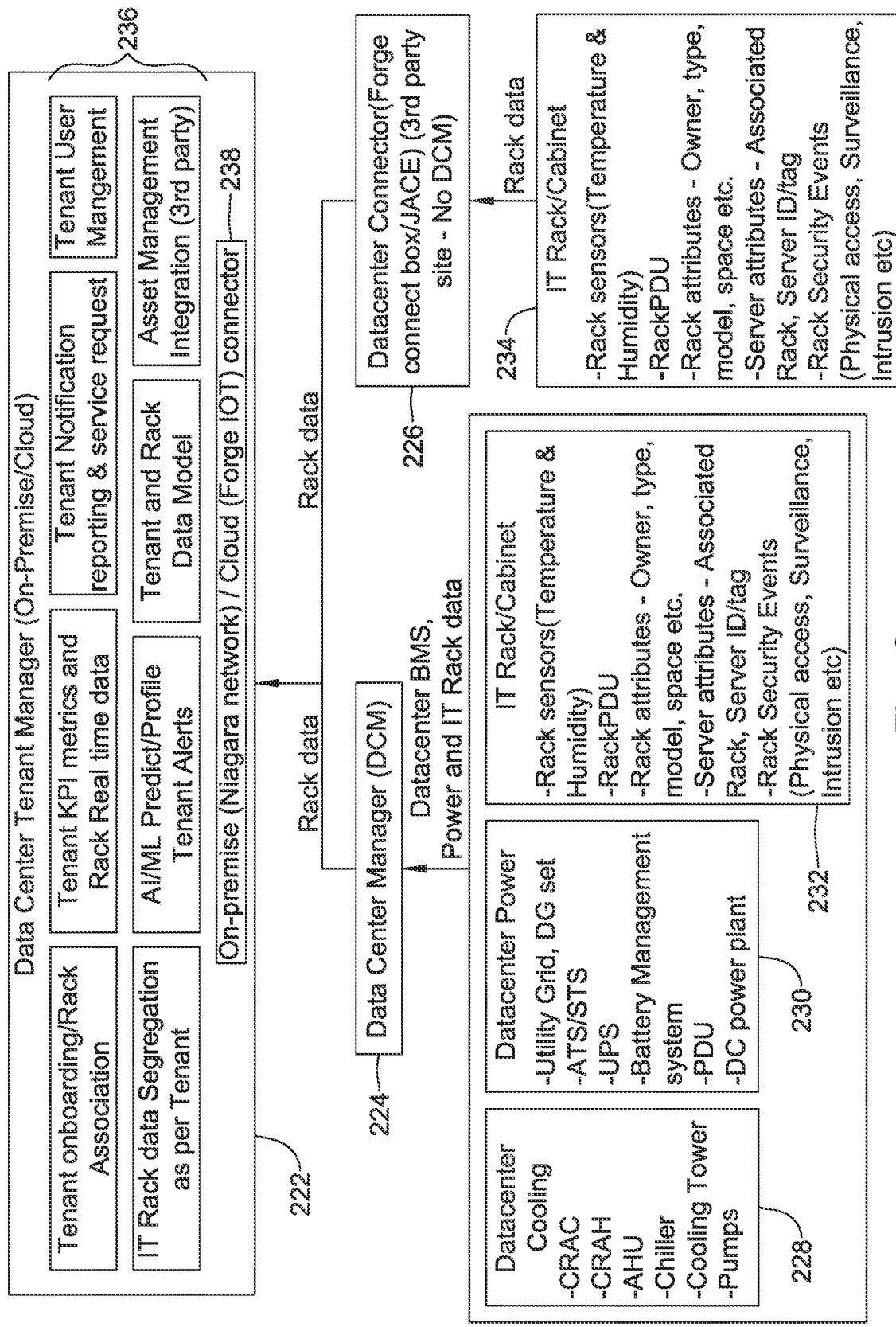
FIG. 9 is a schematic block diagram of an illustrative multi-level system architecture.

FIG. 9 is a schematic block diagram of an illustrative multi-level system architecture 220 including a data center tenant manager 222, a data center manager 224 and a data center connector 226. The data center manager 224 receives information from data center cooling equipment 228. The data center manager 224 receives information from data center power equipment 230. The data center manager 224 receives information from one or more server racks/cabinets 232. The data center connector 226 receives information from one or more server racks/cabinets 234. In some cases, the data center manager 224 and the data center connector 226 both receive information from the same server rack/cabinet 232/234. It will be appreciated that the data center tenant manager 222 includes a number of individual blocks 236 that provide functionality to the data center tenant manager 222. The data center tenant manager 222 also includes an on-premise network 238 that receives information from both the data center manager 224 and the data center connector 226.

FIGS. 10 through 13 are screen shots showing illustrative dashboards that may be displayed for a particular tenant. It will be appreciated that the dashboards may vary, not only in how the data is displayed, but also in what data is displayed. For example, a particular tenant may most concerned with power consumption, and less concerned with thermal performance. For this particular tenant, power data may be emphasized while thermal data is not shown as prominently, or even not at all. Another tenant may be most concerned with space utilization among their assigned server racks, for example.

Figure 10:
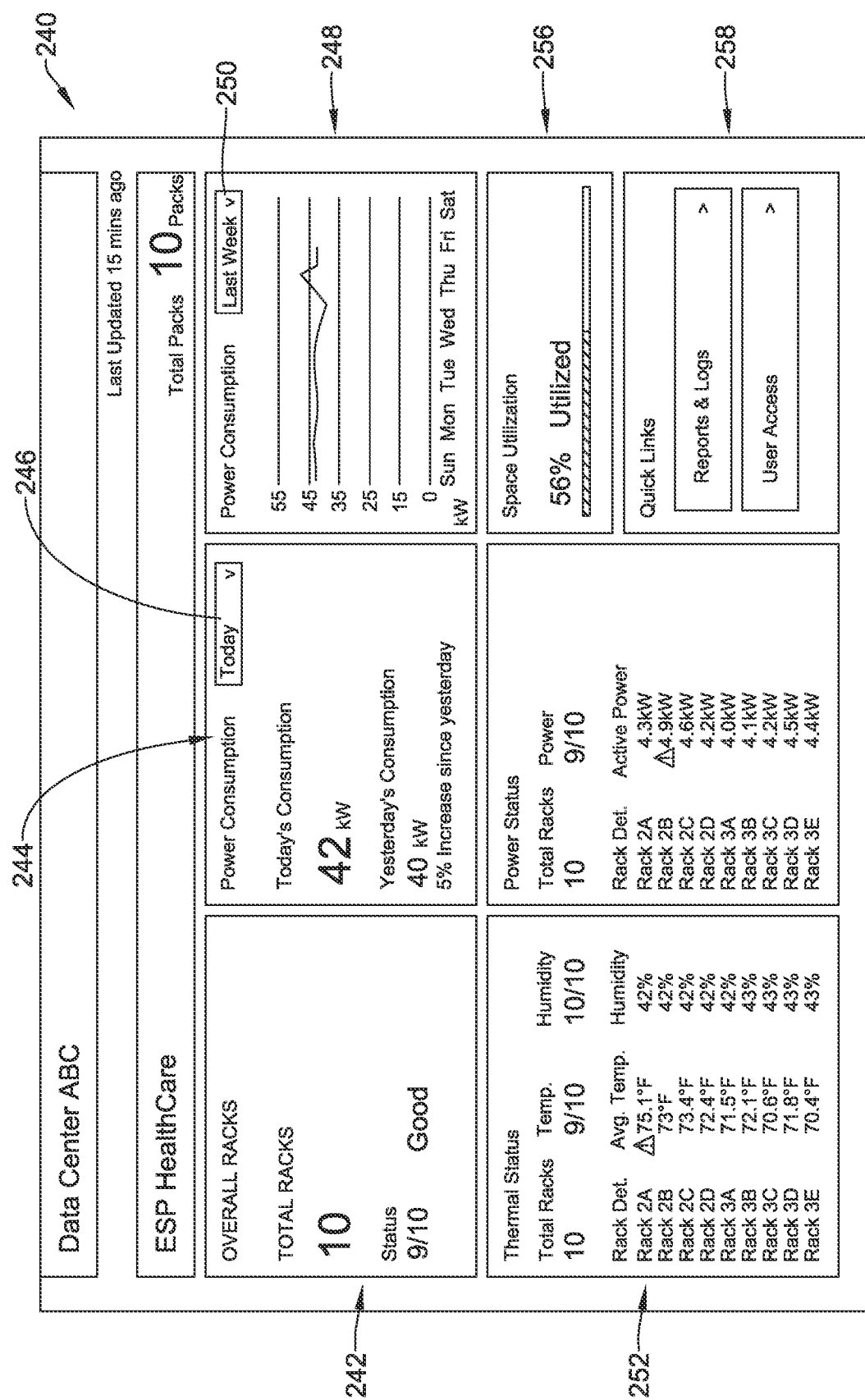
FIGS. 10 through 13 are screen shots showing examples of illustrative dashboards that may be generated by the system of FIG. 3.

FIG. 10 is a screen shot showing an illustrative dashboard 240 that may be displayed for a particular tenant. As can be seen, in this particular example the tenant is named ESP Healthcare. This particular tenant has a total of ten server racks, with 9 out of the 10 server racks currently having a good status, as indicated in a summary section 242. A Power Consumption summary section 244 indicates that today's power consumption totals 42 kilowatts (kW) while yesterday's power consumption totaled 40 kW. A pull-down menu 246 allows a tenant to select a particular time frame to view. A graphical representation of power consumption 248 shows the previous power consumption over the past week. A pull-down menu 250 allows the tenant to select a particular time frame to view.

The illustrative dashboard 240 includes a Thermal Status section 252 that lists server rack name, average temperature and humidity values. Nine of the server racks are within a desired range, but one server rack labeled RACK 2A is a little warmer than the other server racks. In this case, the average temperature of RACK 2A is above a predetermined threshold temperature (75F), and an alert is automatically generated. In the example shown, the alert is displayed on the dashboard as an alert icon (triangle with an "!" inside). The alert icon can be used to quickly identify abnormalities in rack operation. In some cases, the alerts may be displayed in a notification section of the dashboard (see FIG. 11).

A Power Status section lists server rack name and active power consumption. It can be seen that one of the server racks, labeled RACK 2B, is currently consuming a little more power than the other server racks. A Space Utilization section 256 shows that the tenant is currently utilizing 56 percent of the available server space in their assigned server racks. A quick links section 258 allows for the tenant to gain additional information.

Figure 11:
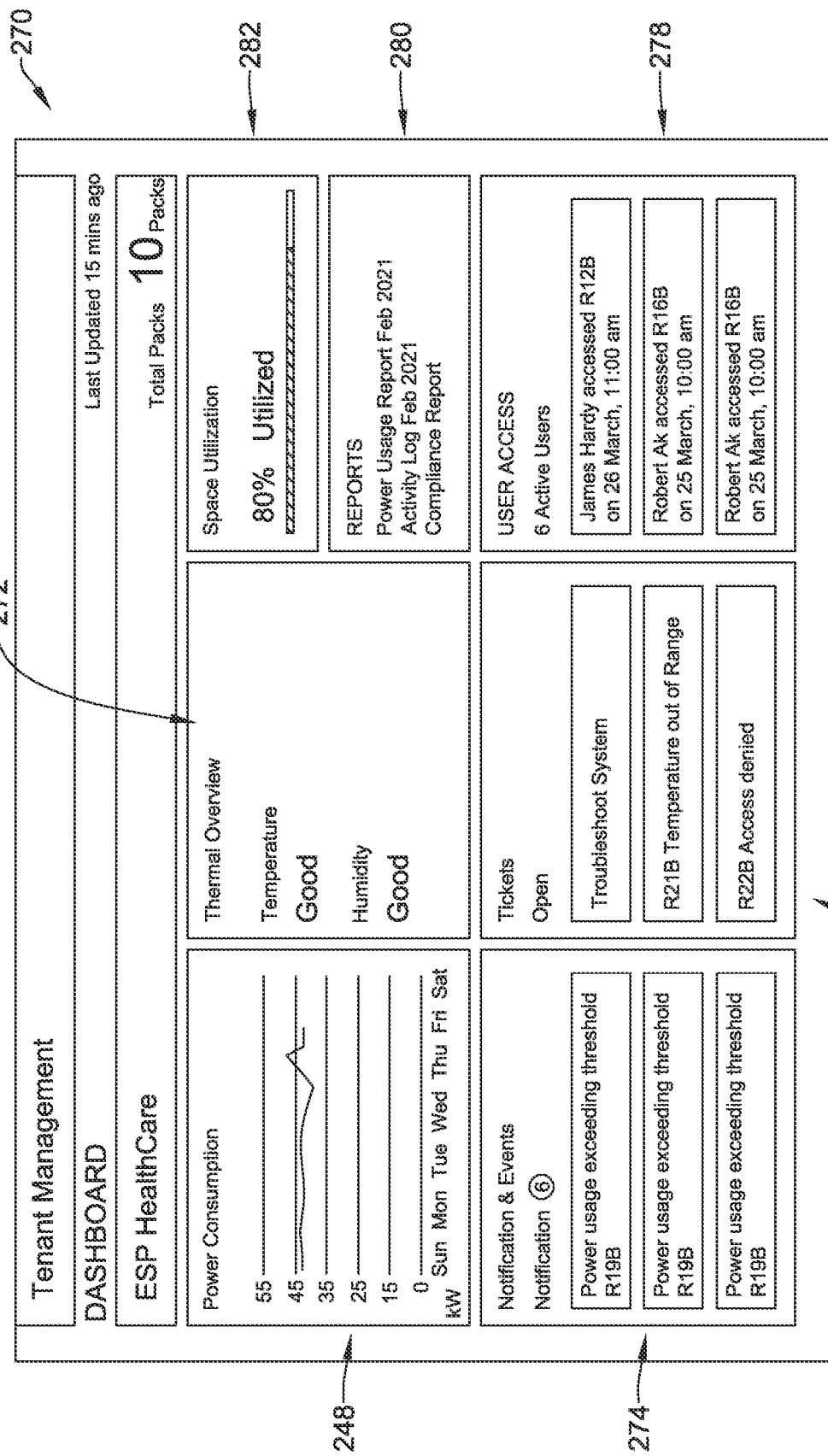

FIG. 11 is a screen shot showing an illustrative dashboard 270 that may be displayed for a displayed for a particular tenant. As can be seen, in this particular example the tenant is once again is named ESP Healthcare. The illustrative dashboard 270 includes a thermal overview section 272 which, instead of listing individual rack temperatures and humidity values, simply provides an overall rating of GOOD for both temperature and humidity. The dashboard 270 includes a Notifications section 274 listing current alerts and/or events, a Tickets section 276 listing issued maintenance tickets, and a User Access section 278 that indicates who has recently accessed one or more of the server racks assigned to the particular tenant. A Reports section 280 lists reports that may be downloaded, and a Space Utilization section 282 shows that the tenant is currently using 80 percent of the available server space in their assigned server racks.

Figure 12:
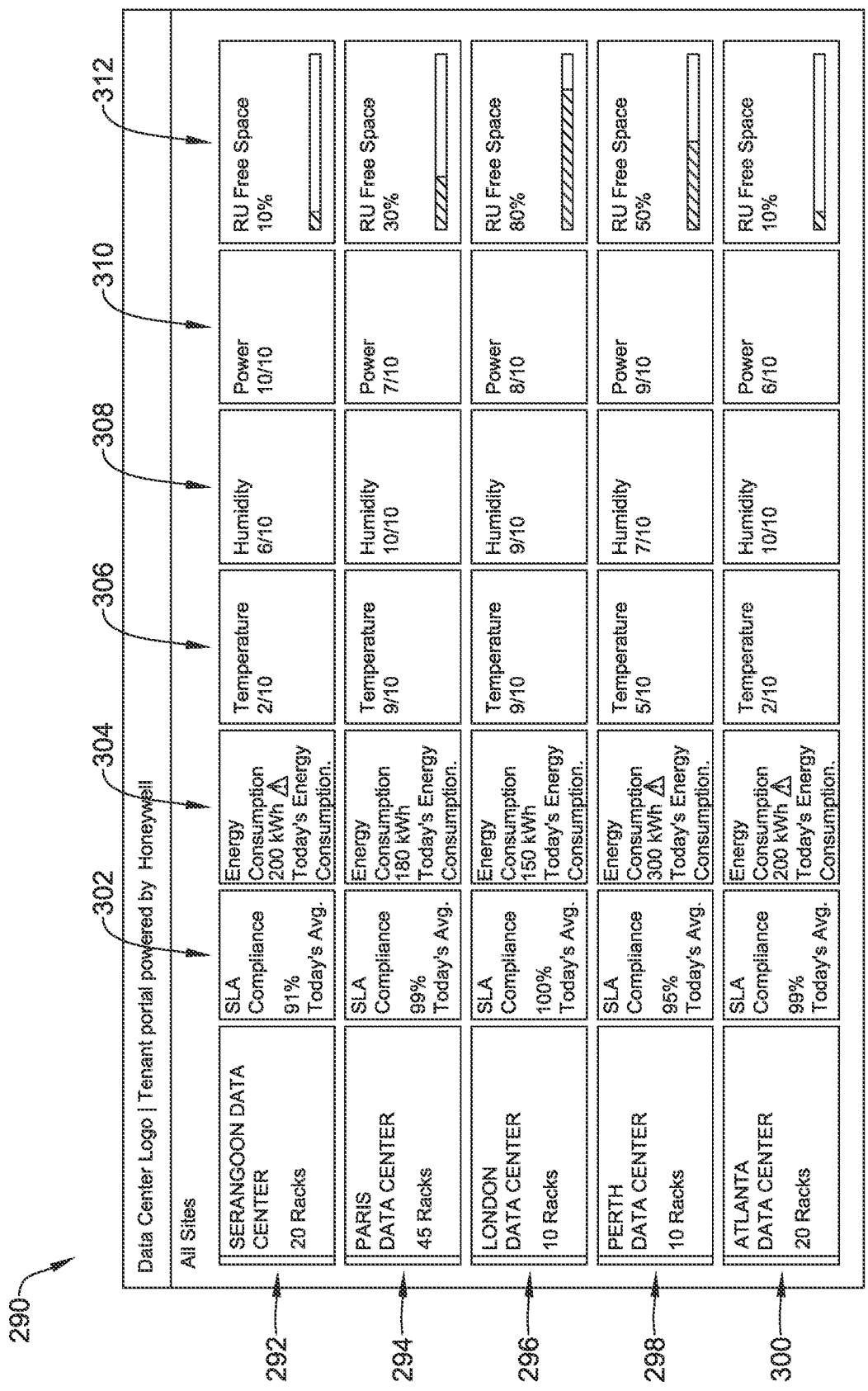

In some cases, a particular tenant may have server racks assigned to them within multiple data centers. FIG. 12 is a screen shot showing an illustrative dashboard 290 that may be displayed for a particular tenant. The dashboard 290 includes information regarding multiple sites, including a first site 292, a second site 294, a third site 296, a fourth site 298 and a fifth site 300. If the particular tenant has more than five sites, a scrolling bar would be displayed in order to allow the tenant to scroll through the listed sites. In the example shown, the data for each site is displayed in a matrix, with the dashboard 290 including a Compliance column 302, an Energy Consumption column 304, a Temperature column 306, a Humidity column 308, a Power column 310 and a Free Space column 312. Alert icons may be used to identify particular performance characteristics that are above a threshold at each location. In some cases, vertical bars along the left side of the dashboard 290 may be colored to indicate if the corresponding site has any active alerts (or not). For example, the vertical bars may be colored red when an alert is currently active at that site, and may be colored green when no alert is current active at that site.

Figure 13:
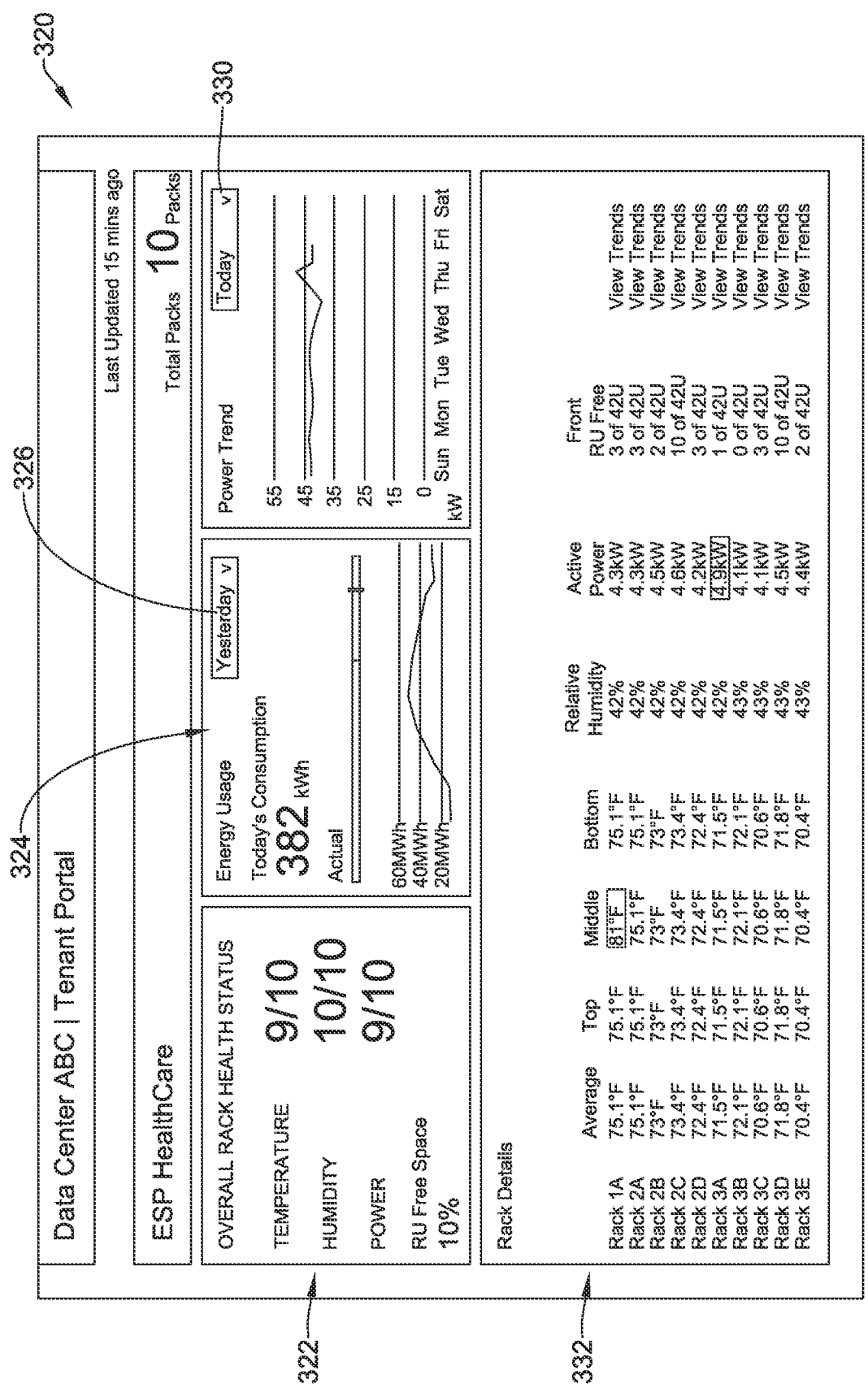

If the tenant selects a particular site, say the first site 292, a new dashboard providing additional information regarding the first site 292 may be displayed, such as that shown in FIG. 13. In FIG. 13, the tenant is still ESP Healthcare, and the particular site is the Sarangoon Data Center. The dashboard 320 includes an Overall Health section 322, an Energy Usage section 324 including a pull-down menu 326 that allows the user to select a particular time frame to display, and a Power Trend section 328 including a pull-down menu 330 that allows the user to select a particular time frame to display. The dashboard 320 also includes a Rack Details section 332 that provides a number of parameters for each of the server racks within the Sarangoon Data Center. As can be seen, the middle of RACK 1A is running a little warm. Current power consumption for RACK 3A is running a little higher than the other server racks. These operational abnormalities are identified by alerts, which in the example shown in FIG. 13, are expressed by highlighting the corresponding parameter in the Rack Details section 332 (in red).

Figure 14:
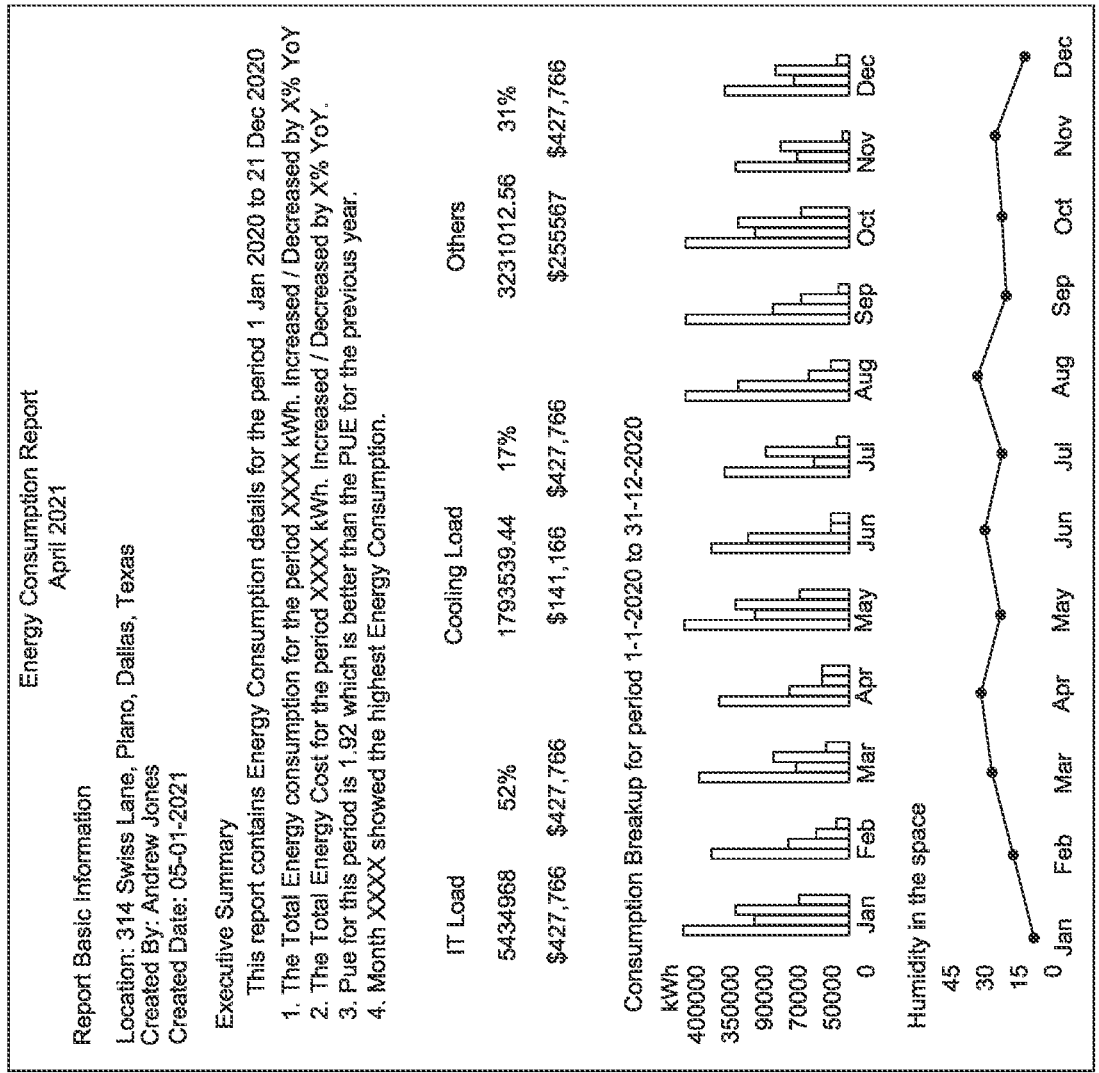
FIGS. 14 through 16 are examples of illustrative reports that may be generated by the system of FIG. 3.
Figure 15:
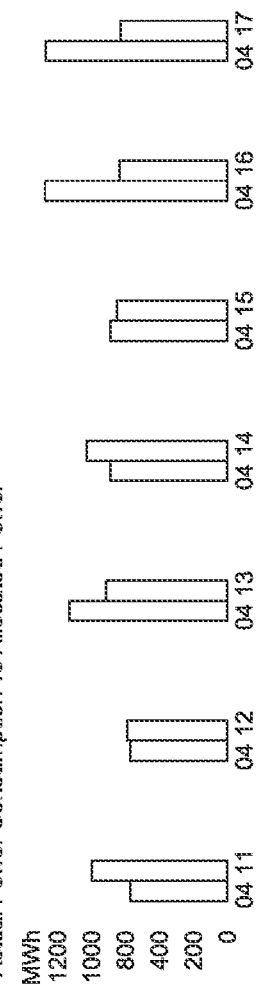
Figure 16:
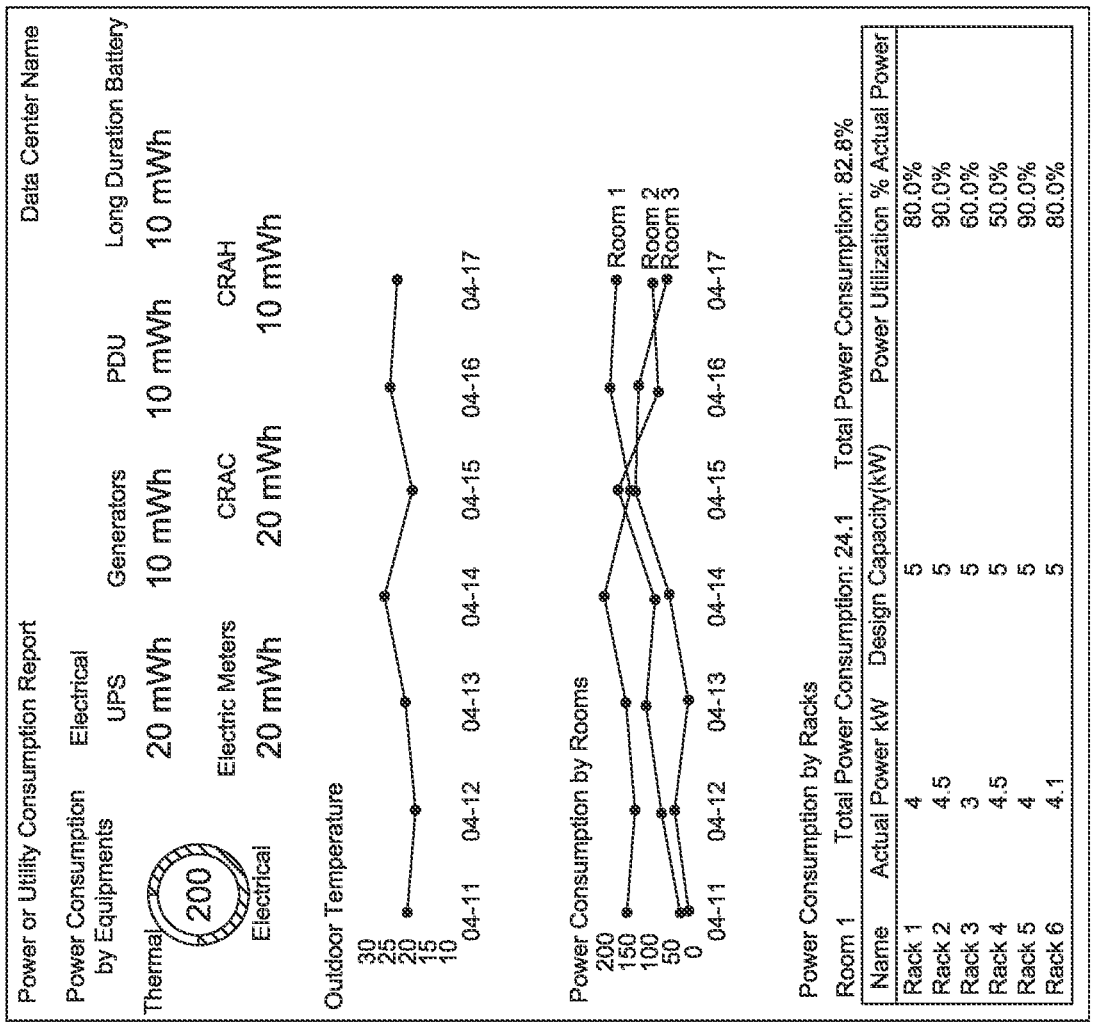

FIG. 14 shows an illustrative report 340 that may be assembled by the controller 48 (FIG. 3) and either downloaded or printed. The dashboard 270 shown in FIG. 11 includes the Reports section 280, which can be used to access various reports. FIG. 15 shows an illustrative report 350 that may be assembled by the controller 48 (FIG. 3) and either downloaded or printed. FIG. 16 shows an illustrative report 360 that may be assembled by the controller 48 (FIG. 3) and either downloaded or printed.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A system for monitoring performance of a data center, the data center including a plurality of server racks with a first set of the plurality of server racks assigned to a first tenant of the data center and a second set of the plurality of server racks assigned to a second tenant of the data center, wherein the first set of the plurality of server racks and the second set of the plurality of server racks are disjoint sets, the system comprising:
    a memory for storing a first tenant profile associated with the first tenant and a second tenant profile associated with the second tenant, the first tenant profile identifies the first set of the plurality of server racks and the second tenant profile identifies the second set of the plurality of server racks;
    a controller operably coupled with the memory, the controller configured to:
        receive a first set of signals from a first set of sensors, the first set of sensors sensing one or more conditions associated with the operation of the first set of the plurality of server racks;
        receive a second set of signals from a second set of sensors, the second set of sensors sensing one or more conditions associated with the operation of the second set of the plurality of server racks;
        determine one or more performance characteristics associated with the first set of the plurality of server racks based at least in part on the first set of signals;
        issue one or more first alerts when one or more of the performance characteristics associated with the first of the plurality of server racks meet or surpass a corresponding threshold;
        determine one or more performance characteristics associated with the second set of the plurality of server racks based at least in part on the second set of signals;
        issue one or more second alerts when one or more of the performance characteristics associated with the second of the plurality of server racks meet or surpass a corresponding threshold;
        generate a first dashboard based at least in part on the first tenant profile, the first dashboard displaying:
            one or more of the performance characteristics associated with the first set of the plurality of server racks;
            an indication of one or more of the first alerts, if any;
        assign first access rights to the first dashboard such that the first dashboard is accessible to the first tenant and not accessible to the second tenant;
        generate a second dashboard based at least in part on the second tenant profile, the second dashboard displaying:
            one or more of the performance characteristics associated with the second set of the plurality of server racks;
            an indication of one or more of the second alerts, if any; and
        assign second access rights to the second dashboard such that the second dashboard is accessible to the second tenant and not accessible to the first tenant.

2. The system of claim 1, wherein the controller is configured to receive user input from one or more remote devices, and wherein:
    the first dashboard is generated by the controller in response to receiving a first user input from the first tenant via one or more of the remote devices; and
    the second dashboard is generated by the controller in response to receiving a second user input from the second tenant via one or more of the remote devices.

3. The system of claim 1, wherein the controller is configured to receive user input from one or more remote devices, and wherein:
    the controller is configured to issue a first maintenance ticket for action by the data center in response to receiving from the first tenant a first user input requesting a first maintenance ticket in response to one or more of the first alerts displayed on the first dashboard.

4. The system of claim 3, wherein the first dashboard further displays a current status of the first maintenance ticket.

5. The system of claim 3, wherein the controller is configured to issue a second maintenance ticket for action by the data center in response to receiving from the second tenant a second user input requesting a second maintenance ticket in response to one or more of the second alerts displayed on the second dashboard.

6. The system of claim 1, wherein the first tenant profile identifies which of the one or more performance characteristics associated with the first set of the plurality of server racks are to be included in the first dashboard, and the second tenant profile identifies which of the one or more performance characteristics associated with the second set of the plurality of server racks are to be included in the second dashboard.

7. The system of claim 1, wherein the controller is configured to predict one or more expected future values of one or more of the performance characteristics associated with the first set of the plurality of server racks, and to display one or more of the predict expected future values on the first dashboard.

8. The system of claim 1, wherein the one or more conditions associated with the operation of the first set of the plurality of server racks comprises two or more of a temperature, a humidity and a power usage associated with each of the plurality of server racks of the first set of the plurality of server racks.

9. The system of claim 1, wherein the first dashboard further displays an identity of one or more individuals that accessed one or more of the first set of the plurality of server racks during a period of time, wherein the period of time is adjustable by the first tenant.

10. The system of claim 1, wherein the controller is further configured to generate a data center dashboard, the data center dashboard displaying:
one or more of the performance characteristics associated with the first set of the plurality of server racks;
one or more of the performance characteristics associated with the second set of the plurality of server racks; and
an operational status of one or more HVAC components servicing the data center.

11. The system of claim 1, wherein the controller is configured to:
automatically generate one or more control actions to control at least part of the data center based at least in part on one or more of the performance characteristics associated with the first set of the plurality of server racks and/or one or more of the performance characteristics associated with the second set of the plurality of server racks; and
automatically execute the one or more control actions.

12. The system of claim 11, wherein the controller is configured to automatically identify one or more events based at least in part on one or more of the performance characteristics associated with the first set of the plurality of server racks and/or one or more of the performance characteristics associated with the second set of the plurality of server racks, and wherein the one or more control actions are automatically generated in response to one or more of the automatically identified events.

13. A method for monitoring performance of a data center, the data center including a plurality of server racks with a first set of the plurality of server racks assigned to a first tenant of the data center and a second set of the plurality of server racks assigned to a second tenant of the data center, wherein the first set of the plurality of server racks and the second set of the plurality of server racks are disjoint sets, the method comprising:
storing a first tenant profile associated with the first tenant and a second tenant profile associated with the second tenant, the first tenant profile identifies the first set of the plurality of server racks and the second tenant profile identifies the second set of the plurality of server racks;
receiving a first set of signals from a first set of sensors, the first set of sensors sensing one or more conditions associated with the operation of the first set of the plurality of server racks;
determining one or more performance characteristics associated with the first set of the plurality of server racks based at least in part on the first set of signals;
issuing one or more first alerts when one or more of the performance characteristics associated with the first of the plurality of server racks meet or surpass a corresponding threshold;
receiving user input from one or more remote devices;
in response to receiving a first user input from the first tenant via one or more of the remote devices, generating a first dashboard based at least in part on the first tenant profile, the first dashboard displaying:
one or more of the performance characteristics associated with the first set of the plurality of server racks;
an indication of one or more of the first alerts, if any; and
assigning first access rights to the first dashboard such that the first dashboard is accessible to the first tenant and not accessible to the second tenant.

14. The method of claim 13, further comprising
receiving a second set of signals from a second set of sensors, the second set of sensors sensing one or more conditions associated with the operation of the second set of the plurality of server racks;
determining one or more performance characteristics associated with the second set of the plurality of server racks based at least in part on the second set of signals;
issuing one or more second alerts when one or more of the performance characteristics associated with the second of the plurality of server racks meet or surpass a corresponding threshold;
in response to receiving a second user input from the second tenant via one or more of the remote devices, generating a second dashboard based at least in part on the second tenant profile, the second dashboard displaying:
one or more of the performance characteristics associated with the second set of the plurality of server racks;
an indication of one or more of the second alerts, if any; and
assigning second access rights to the second dashboard such that the second dashboard is accessible to the second tenant and not accessible to the first tenant.

15. The method of claim 14, further comprising:
generating a data center dashboard that is not accessible to the first tenant or the second tenant, wherein the data center dashboard displays:
one or more of the performance characteristics associated with the first set of the plurality of server racks;
one or more of the performance characteristics associated with the second set of the plurality of server racks; and
an operational status of one or more HVAC components servicing the data center.

16. The method of claim 13, further comprising issuing a first maintenance ticket for action by the data center in response to receiving from the first tenant a first user input requesting a first maintenance ticket in response to one or more of the first alerts displayed on the first dashboard.

17. The method of claim 16, wherein the first dashboard further displays a current status of the first maintenance ticket.

18. The method of claim 13, wherein the one or more conditions associated with the operation of the first set of the plurality of server racks comprises a temperature, a humidity and a power usage associated with each of the plurality of server racks of the first set of the plurality of server racks.

19. A non-transitory computer readable medium for storing instructions that when executed by one or more processors causes the one or more processors to:
- store a first tenant profile associated with a first tenant and a second tenant profile associated with a second tenant, the first tenant profile identifies a first set of a plurality of server racks of a data center and the second tenant profile identifies a second set of the plurality of server racks of the data center;
- receive a first set of signals from a first set of sensors, the first set of sensors sensing one or more conditions associated with the operation of the first set of the plurality of server racks;
- receive a second set of signals from a second set of sensors, the second set of sensors sensing one or more conditions associated with the operation of the second set of the plurality of server racks;
- determine one or more performance characteristics associated with the first set of the plurality of server racks based at least in part on the first set of signals;
- determine one or more performance characteristics associated with the second set of the plurality of server racks based at least in part on the second set of signals;
- issue one or more first alerts when one or more of the performance characteristics associated with the first of the plurality of server racks meet or surpass a corresponding threshold;
- issue one or more second alerts when one or more of the performance characteristics associated with the second of the plurality of server racks meet or surpass a corresponding threshold;
- receive user input from one or more remote devices;
- in response to receiving a first user input from the first tenant via one or more of the remote devices, generate a first dashboard based at least in part on the first tenant profile, the first dashboard displaying:
  - one or more of the performance characteristics associated with the first set of the plurality of server racks, wherein the first tenant profile identifies at least one of the performance characteristics that is to be displayed by the first dashboard;
  - an indication of one or more of the first alerts, if any;
- assign first access rights to the first dashboard such that the first dashboard is accessible to the first tenant and not accessible to the second tenant;
- in response to receiving a second user input from the second tenant via one or more of the remote devices, generate a second dashboard based at least in part on the second tenant profile, the second dashboard displaying:
  - one or more of the performance characteristics associated with the second set of the plurality of server racks, wherein the second tenant profile identifies at least one of the performance characteristics that is to be displayed by the second dashboard;
  - an indication of one or more of the second alerts, if any; and
- assign second access rights to the second dashboard such that the second dashboard is accessible to the second tenant and not accessible to the first tenant.

20. The non-transitory computer readable medium of claim 19, wherein the instructions cause the one or more processors to:
- generate a data center dashboard that is not accessible to the first tenant or the second tenant, wherein the data center dashboard displays:
- one or more of the performance characteristics associated with the first set of the plurality of server racks;
- one or more of the performance characteristics associated with the second set of the plurality of server racks; and
- an operational status of one or more HVAC components servicing the data center.

\* \* \* \* \*